US006842392B2

(12) United States Patent
Mizugaki et al.

(10) Patent No.: US 6,842,392 B2
(45) Date of Patent: *Jan. 11, 2005

(54) ACTIVATION OF WORD LINES IN SEMICONDUCTOR MEMORY DEVICE

(75) Inventors: Koichi Mizugaki, Suwa (JP); Eitaro Otsuka, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 513 days.

This patent is subject to a terminal disclaimer.

(21) Appl. No.: 09/976,021

(22) Filed: Oct. 15, 2001

(65) Prior Publication Data

US 2002/0051389 A1 May 2, 2002

(30) Foreign Application Priority Data

Oct. 27, 2000 (JP) .................................. 2000-328110

(51) Int. Cl.⁷ ................................................ G11C 7/00
(52) U.S. Cl. ............... 365/222; 365/233.5; 365/230.03
(58) Field of Search ............................. 365/222, 233.5, 365/230.03

(56) References Cited

U.S. PATENT DOCUMENTS

| 4,926,384 A | * | 5/1990 | Roy | ............................ 365/222 |
| 5,335,206 A | * | 8/1994 | Kawamoto | ............... 365/233.5 |
| 6,525,989 B2 | * | 2/2003 | Mizugaki et al. | ........ 365/233.5 |

FOREIGN PATENT DOCUMENTS

| JP | A 63-247997 | 10/1988 |
| JP | A 4-106782 | 4/1992 |
| JP | A 4-132075 | 5/1992 |
| JP | A 5-182452 | 7/1993 |
| JP | A 5-250867 | 9/1993 |
| JP | A 5-325544 | 12/1993 |
| JP | A 7-296579 | 11/1995 |
| JP | A 8-129876 | 5/1996 |
| JP | A 8-129882 | 5/1996 |
| JP | A 8-339686 | 12/1996 |
| JP | 11-297067 | 10/1999 |
| JP | A 11-306753 | 11/1999 |
| JP | A 2003-074944 | 3/2003 |
| JP | A 2003-085970 | 3/2003 |

* cited by examiner

Primary Examiner—Huan Hoang
(74) Attorney, Agent, or Firm—Oliff & Berridge, PLC

(57) ABSTRACT

To provide a technique for reducing the power consumption associated with word line activation in a semiconductor memory device. The semiconductor memory device is provided with a word line activation controller for controlling word line activation. Where consecutive operation cycles use multiple-bit addresses that include an identical row address, the word line activation controller can maintain an the activated state of a word line activated during an initial cycle of the consecutive cycles, without deactivating it until a final cycle of the consecutive cycles. If a refresh operation is to be performed during a cycle among the consecutive cycles after the initial cycle, the word line activation controller can deactivate the activated word line prior to performing the refresh operation.

8 Claims, 19 Drawing Sheets

|  | #CS | ZZ | REFRESH MODE (Note) |
|---|---|---|---|
| OPERATION | L | H | MODE 1 |
| STANDBY | H | H | MODE 1 |
| SNOOZE (POWER DOWN) | H | L | MODE 2 |

(Note)
 Refresh mode 1: refresh operation performed in sync with ATD signal after refresh timing signal issued in memory chip
 Refresh mode 2: refresh operation performed in response to generation of refresh timing signal in memory chip (address input not required)

ACTIVATION OF WORD LINES IN SEMICONDUCTOR MEMORY DEVICE

BACKGROUND OF THE INVENTION

1. Field of the Invention

The present invention relates to control of word line activation in a semiconductor memory device.

2. Description of the Related Art

Commonly used semiconductor memory devices include DRAM and SRAM. It is common knowledge that while DRAM offers higher capacity at lower price than SRAM, it requires refresh operations. SRAM, on the other hand, while easier to use due to the lack of a need for refresh operations, is more expensive and has lower capacity than DRAM.

Virtual SRAM (known as VSRAM or PSRAM) is a semiconductor memory device that offers that advantages of both DRAM and SRAM. Virtual SRAM has a memory cell array composed of dynamic memory cells identical to those in DRAM, and also houses a refresh controller that allows refresh operations to be performed internally. Thus, external devices connected to virtual SRAM (such as a CPU) can access (i.e., read or write data) virtual SRAM without being aware of refresh operations. This feature of virtual SRAM is known as "refresh transparency."

During each cycle in which virtual SRAM is accessed, the word line selected by an address must be activated and deactivated. However, in instances where, for example, the same word line is activated during consecutive cycles, repeated activation and deactivation of the word line during each cycle represents a waste of power. This problem is not limited to virtual SRAM, being common to all semiconductor memory devices in which word lines are repeatedly activated and deactivated in each cycle.

SUMMARY OF THE INVENTION

An object of the present invention is to provide a technique for reducing the power consumption associated with word line activation in semiconductor memory devices.

At least part of the above and the other related objects is attained by a semiconductor memory device. A semiconductor memory device includes: at least one memory cell block of dynamic memory cells arranged in a matrix, the memory cell block including a plurality of word lines; an address input section for input of a multiple-bit address that includes a row address for selecting one of the plurality of word lines; a data input/output section for input/output of data corresponding to a memory cell selected by the multiple-bit address; and a word line activation controller for controlling activation of the word lines. The word line activation controller includes: a row address transition detector for detecting whether the row address has changed. (a) In a first case that the row address transition detector does not detect a change in the row address during consecutive cycles in which at least one of read and write operations of data for the memory cells are enabled and in which an identical row address is used, the word line activation controller can maintain an activated state of a word line activated during an initial cycle of the consecutive cycles, without deactivation thereof until a final cycle of the consecutive cycles. (b) In a second case that a refresh operation is to be performed during a cycle among the consecutive cycles after the initial cycle, the word line activation controller can deactivate the activated word line prior to performing the refresh operation.

The cycle among the consecutive cycles after the initial cycle, in which the refresh operation is to be performed, may be the final cycle, or a cycle other than the final cycle.

The semiconductor memory device herein includes a word line activation controller. When consecutive cycles use addresses that include the same given row address, the word line activation controller is capable of maintaining a word line that has been activated during the initial cycle in the activated state up to the final cycle that uses the same given row address. If a refresh operation becomes necessary, the word line activation controller can deactivate the activated word line without waiting for the final cycle.

The word line activation controller herein enables refresh operations to be performed in the semiconductor memory device, while obviating the need to repeatedly activate and deactivate word lines during period in which no refresh operations are performed, thereby reducing the power consumption associated with word line activation.

The advantages of the device herein are particularly notable in cases where data read/write operations on memory cells on an activated word line are performed during two or more cycles among a plurality of cycles that extend from an initial cycle to a final cycle.

In the semiconductor memory device, it is preferable that the address input section is simultaneously supplied with a column address as well as with the row address; and the row address is assigned to a plurality of uppermost bits of the multiple-bit address.

By assigning the row address to the uppermost bits, the row address becomes relatively less likely to change, so that word lines can be more frequently maintained in the activated state, thereby reducing the power consumption associated with word line activation.

The above semiconductor memory device may include a plurality of the memory cell blocks; and the multiple-bit address may include a block address for selecting any one memory cell block from among the plurality of the memory cell blocks. In this arrangement, it is preferable that the word line activation controller is capable of: in the first case, maintaining the activated state of the word line in a first memory cell block activated during the initial cycle, without deactivation thereof until the final cycle; and additionally, when a read or write operation of data on a memory cell in a second memory cell block different from the first memory cell block is performed during any arbitrary cycle among the consecutive cycles after the initial cycle, maintaining an activated state of a word line in the second memory cell block activated during the arbitrary cycle, without deactivation thereof until the final cycle. And it is preferable that the word line activation controller is capable of: in the second case, deactivating the activated word line in the first memory cell block prior to performing the refresh operation in the first memory cell block; and additionally, when the second memory cell block contains an activated word line, deactivating the activated word line in the second memory cell block prior to performing the refresh operation in the second memory cell block.

It should be noted that the arbitrary cycle among the consecutive cycles after the initial cycle may be the final cycle, or a cycle other than the final cycle.

Where there are a plurality of memory cell blocks, the word line activation controller can simultaneously maintain word lines in the activated state in two or more memory cell blocks. If a refresh operation becomes necessary, activated word lines in a block can be deactivated prior to refreshing the memory cell block.

This word line activation controller allows refresh operations to be performed in the semiconductor memory device, while enabling more frequent data read/write operations to memory cells on an activated word line during period that no refresh operations are being performed. This arrangement thus considerably reduces the power consumption associated with word line activation.

In the above semiconductor memory device, it is preferable that, during a cycle in which a read or write operation of data is performed in one memory cell block from among the plurality of memory cell blocks, the refresh operation is performed on memory cell blocks other than the memory cell block on which the read or write operation of data is currently being performed, refreshing of the currently read or written memory cell block being performed during a cycle after the read or write operation has been completed. When each of the memory cell blocks being refreshed contains an activated word line, the word line activation controller can deactivate the activated word line just prior to performing the refresh operation in each of the memory cell blocks.

With this arrangement, read/write operations can be performed in one of a plurality of memory cell blocks while allowing other memory cell blocks to be refreshed, enabling data read/write operations in the semiconductor memory device to be performed relatively fast.

The present invention is also directed to a method for controlling activation of word lines in a semiconductor memory device. The semiconductor memory device includes: at least one memory cell block of dynamic memory cells arranged in a matrix, the memory cell block including a plurality of word lines; an address input section for input of a multiple-bit address that includes a row address for selecting one of the plurality of word lines; and a data input/output section for input/output of data corresponding to a memory cell selected by the multiple-bit address. (a) In a first case that no change in the row address is detected during consecutive cycles in which at least one of read and write operations of data for the memory cells are enabled and in which an identical row address is used, an activated state of a word line activated during an initial cycle of the consecutive cycles is maintained, without deactivation thereof until a final cycle of the consecutive cycles. (b) In a second case that a refresh operation is to be performed during a cycle among the consecutive cycles after the initial cycle, the activated word line is deactivated prior to performing the refresh operation.

The method herein affords advantages and effects similar to those derived from use of the device herein, allowing refresh operations to be performed in the semiconductor memory device while reducing the power consumption associated with word line activation.

The invention may be embodied in any of a number of forms, for example, a semiconductor memory device; a word line activation control method therefor; a semiconductor memory system comprising a semiconductor memory device and a control device; a method for controlling a semiconductor memory device; or an electronic device comprising a semiconductor memory device.

These and other objects, features, aspects, and advantages of the present invention will become more apparent from the following detailed description of the preferred embodiments with the accompanying drawings.

DESCRIPTION OF THE PREFERRED EMBODIMENT

Figures 1, 2:
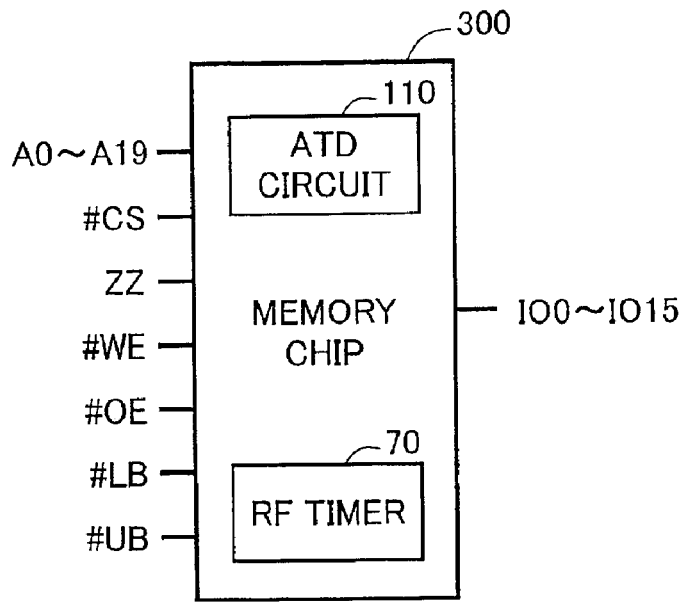
FIG. 1 is an illustrative diagram showing the pinout of a memory chip 300 pertaining to an embodiment of the invention.
FIG. 2 is an illustrative diagram showing the operating modes of memory chip 300 associated with different levels of chip select signal #CS and snooze signal ZZ.

An exemplary embodiment of the invention is described in the following order.
A. Summary of memory chip pinout and operating modes:
B. Overall memory chip internal design:
C. Internal design of word line activation controller:
D. Operation of word line activation controller:
   D1. Operation during operation cycle (with no refresh request):

D2. Operation during operation cycle (with a refresh request):
D3. Operation in standby cycle and snooze mode:
E. Example of application in an electronic device:

A. Summary of Memory Chip Pinout and Operating Modes:

FIG. 1 is an illustrative diagram showing the pinout of a memory chip 300 pertaining an embodiment of the invention. Memory chip 300 has the following terminals.
A0–A19: address input terminals (20)
CS: chip select input terminal
ZZ: snooze input terminal
WE: write enable input terminal
OE: output enable input terminal
LB: lower byte enable input terminal
UB: upper byte enable input terminal
IO0–IO15: I/O data terminals (16)

In the following discussion the same symbols are used to denote both the terminal name and the signal name. A "#" preceding a terminal name (or signal name) denotes negative logic. While a plurality of address input terminals A0–A19 and I/O data terminals IO0–IO15 are provided, these are depicted in simplified form in FIG. 1.

Memory chip 300 is configured to function as virtual SRAM (VSRAM) so as to enable access in substantially the same manner as ordinary asynchronous SRAM. However, in contrast to SRAM, it uses dynamic memory cells, and thus requires refreshing within a predetermined period. Accordingly, memory chip 300 has an integrated refresh controller that includes a refresh timer 70. Herein, data read and write operations by external devices (controller devices) shall be referred to as "external access" and refresh operations performed by the integrated refresh controller shall be referred to as "internal refresh" operations or simply "refresh" operations.

Within memory chip 300 is provided an address transition detecting circuit 110 for detecting any change of one or more bits in the input addresses A0–A19. The circuits in memory chip 300 operate on the basis of address transition signals supplied by address transition detecting circuit 110. For example, arbitration between external access and refresh operations is executed on the basis of address transition signals. In the following description, address transition detecting circuit 110 shall be referred to as "ATD circuit" and address transition signals as "ATD signals".

The chip select signal #CS and snooze signal ZZ depicted in FIG. 1 are used to control the operating mode of memory chip 300. FIG. 2 is an illustrative diagram showing the operating modes of memory chip 300 associated with different signal levels of chip select signal #CS and snooze signal ZZ. Herein, "H level" refers to "1" level of the two levels of a binary signal, and "L" level refers to "0" level.

When chip select signal #CS is L level (active) and snooze signal ZZ is H level, a read/write operation cycle (hereinafter referred to simply as "operation cycle" or "read/write cycle") is performed. External access is enabled during operation cycles, and internal refresh operation is performed at appropriate times.

When chip select signal #CS and snooze signal ZZ are both H level, a standby cycle is performed. In the standby cycle external access is disabled, so all word lines are in the inactive state. However, word lines indicated by refresh addresses will be activated during internal refresh operations.

When chip select signal #CS is H level (inactive) and snooze signal ZZ is L level, memory chip 300 goes into snooze mode (termed "power down mode"). In snooze mode all circuits not needed for refresh operations are halted. Since power consumption in snooze mode is very low, it is suited to backup of data held in memory.

Refresh operations are performed according to a first refresh mode in the operation cycle and standby cycle, and according to a second refresh mode in snooze mode. In first refresh mode, refresh operations are initiated in sync with an ATD signal after the refresh timer 70 has generated a refresh timing signal. In second refresh mode, on the other hand, refresh operations are initiated instantaneously when the refresh timer 70 generates a refresh timing signal. Since refresh operations in second refresh mode are not synchronized with the ATD signal, address A0–A19 input is not required. In this way, memory chip 300 performs refresh operations according to refresh modes optimized for each of the three operating modes. Refresh operations in the two refresh modes will be described in greater detail later.

Address A0–A19 shown in FIG. 1 consists of 20 bits, and indicates a megaword address. I/O data IO0–IO15 consists of 16-bit word data. That is, one value of address A0–A19 corresponds to 16 bits (1 word), enabling 16 bits of I/O data IO0–IO15 to be input or output at any one time.

In an operation cycle, when the write enable signal #WE goes to L level a write cycle is performed, and when it goes to H level a read cycle is performed. When output enable signal #OE goes to L level, output by I/O data terminals IO0–IO15 is enabled. Lower byte enable signal #LB and upper byte enable signal #UB are control signals for performing a read or write of only one byte, either the lower byte or the upper byte of a word (16 bits). For example, when lower byte enable signal #LB is set to L level and upper byte enable signal #UB is set to H level, only the lower 8 bits of a word will be read or written. The power supply terminal is not shown in FIG. 1.

FIGS. 3(a)–3(h) are timing charts summarizing operation of memory chip 300. From changes in chip select signal #CS and snooze signal ZZ it may be determined, on an as-needed basis, which of the three states in FIG. 2 (operation, standby, or snooze) the device is in. The first three cycles shown in FIGS. 3(a)–3(h) represent an operation cycle. In the operation cycle, either a read cycle or write cycle is performed depending on the level of write enable signal #WE. The shortest cycle Tc of the ATD signal (i.e., the shortest cycle of change in address A0–A19) corresponds to the cycle time (termed "cycle period") of memory chip 300. Cycle time Tc is a value set within the range of about 50 ns to about 100 ns, for example.

Figure 3:
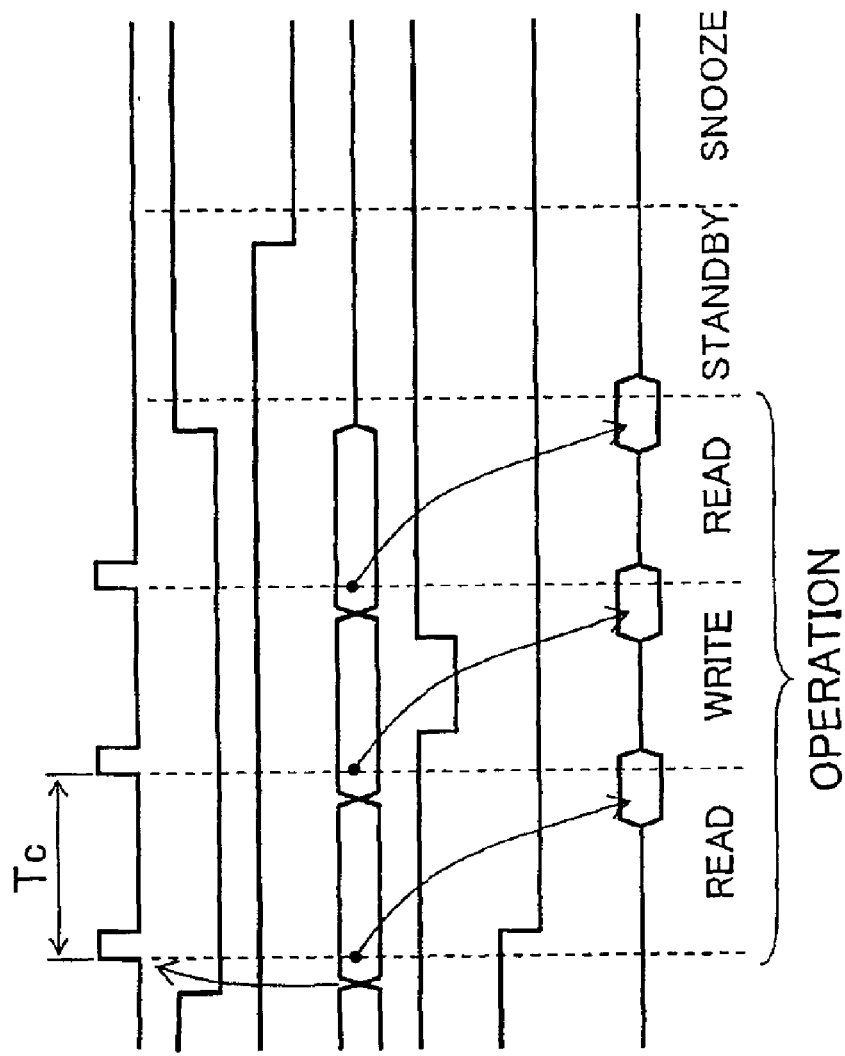
FIGS. 3(a)–3(h) are timing charts summarizing operation of memory chip 300.

In the fourth cycle in FIGS. 3(a)–3(h), chip select signal #CS rises to H level whereupon standby cycle is initiated. In the fifth cycle, snooze signal ZZ additionally drops to L level, whereupon memory chip 300 enters snooze mode. As shown in FIG. 3(a), no ATD signal is issued when there is no change in address A0–A19.

Figure 4:
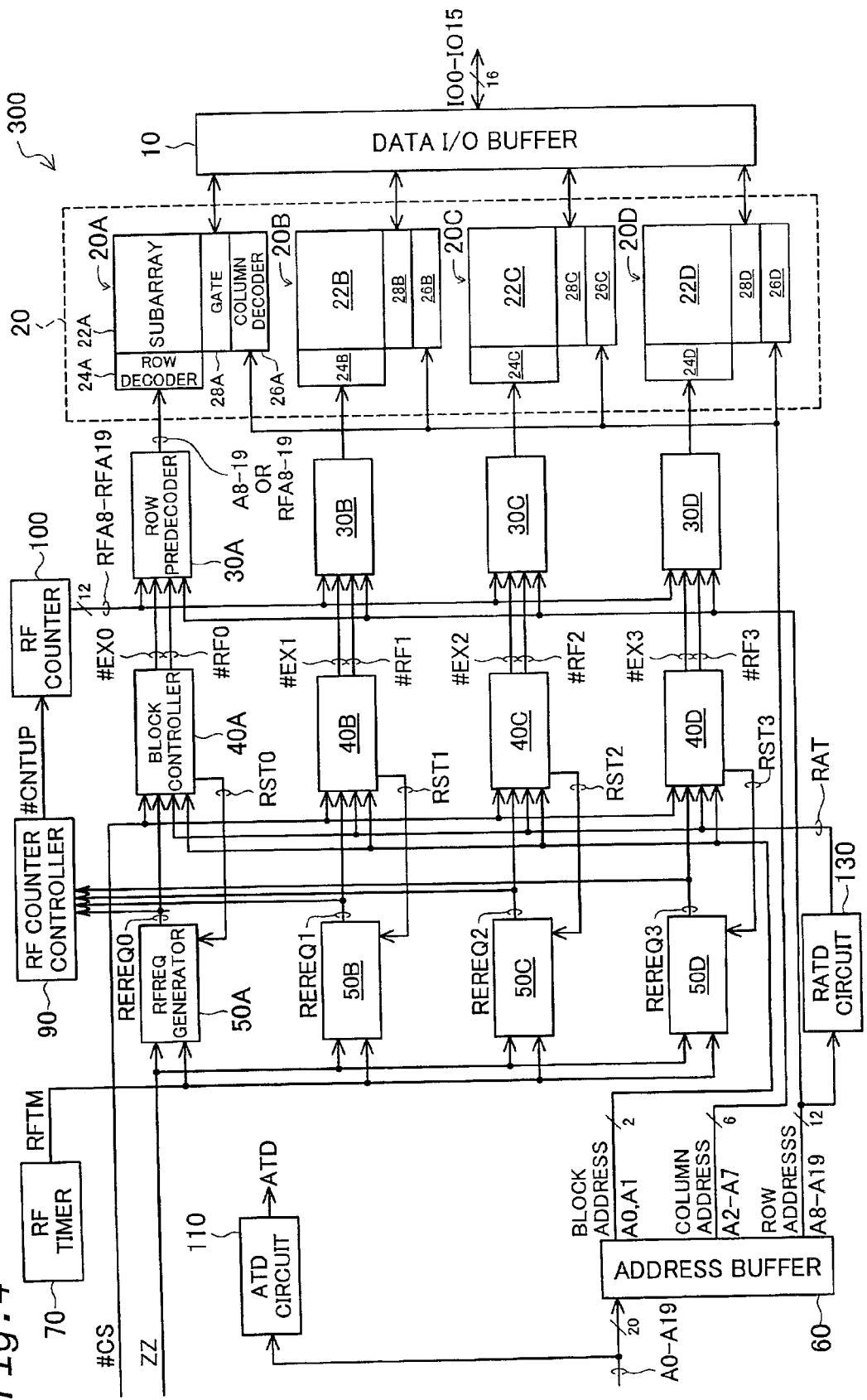
FIG. 4 is a block diagram showing the internal arrangement of memory chip 300.

B. Overall Memory Chip Internal Design:

FIG. 4 is a block diagram showing the internal arrangement of memory chip 300. Memory chip 300 comprises a data I/O buffer 10, a memory array 20, and an address buffer 60.

Memory array 20 is divided into four blocks 20A–20D. The first block 20A has a memory cell subarray 22A, a row decoder 24A, a column decoder 26A, and a gate 28A. The other blocks 20B–20D are analogous in design. As the design of blocks 20A–20D is substantially the same, the following discussion shall focus principally on the first block 20A and its related circuitry.

The arrangement of the one block 20A is similar to that of a typical DRAM memory cell array. Subarray 22A includes a plurality of 1-transistor/1-capacitor type memory cells in a matrix array. Each memory cell is connected to a word line and a pair of bit lines (also termed "a pair of data lines"). Row decoder 24A includes a row driver, and selects and activates one of the plurality of word lines in subarray 22A in response to a row address supplied to it. Column decoder 26A includes a column driver, and in response to a column address supplied to it simultaneously selects bit line pairs equivalent to one word (16 bits) from among the plurality of bit line pairs in subarray 22A. Gate 28A includes a write circuit and a read circuit, and enables exchange of data between data output buffer 10 and subarray 22A. A precharge circuit, sense amplifier, etc. (not shown) are also provided in block 20A.

Address buffer 60 is a circuit that supplies a 20-bit address A0–A19 from an external device to the other internal circuits. The lowest 2-bit address A0–A1 is used as a block address for selecting one of the four blocks 20A–20D. The 6-bit address A2–A7 above block address A0–A1 is used as the column address, and the upper 12-bit address A8–A19 is used as the row address. Thus, one of the four blocks 20A–20D is selected by means of block address A0–A1, and from the selected block memory cells equivalent to one word (16 bits) of data is selected by means of column address A2–A7 and row address A8–A19. The word of data from the selected memory cells is either read or written via data I/O buffer 10. That is, an external device can access memory cells equivalent to one word in one block by inputting a single address A0–A19.

To each of the blocks 20A–20D are connected, in order, a row predecoder 30A–30D, a block controller 40A–40D, and a refresh request signal generator 50A–50D. Within memory chip 300 are additionally provided a refresh timer 70, a refresh counter controller 90, a refresh counter 100, an ATD (address transition detecting) circuit 110 and a row address transition detecting circuit 130.

ATD circuit 110 detects whether there has been any change of one bit or more in the 20-bit address A0–A19 supplied by an external device, and in the event that it detects a change it generates an ATD signal like that shown in FIG. 3(a).

Figure 5:
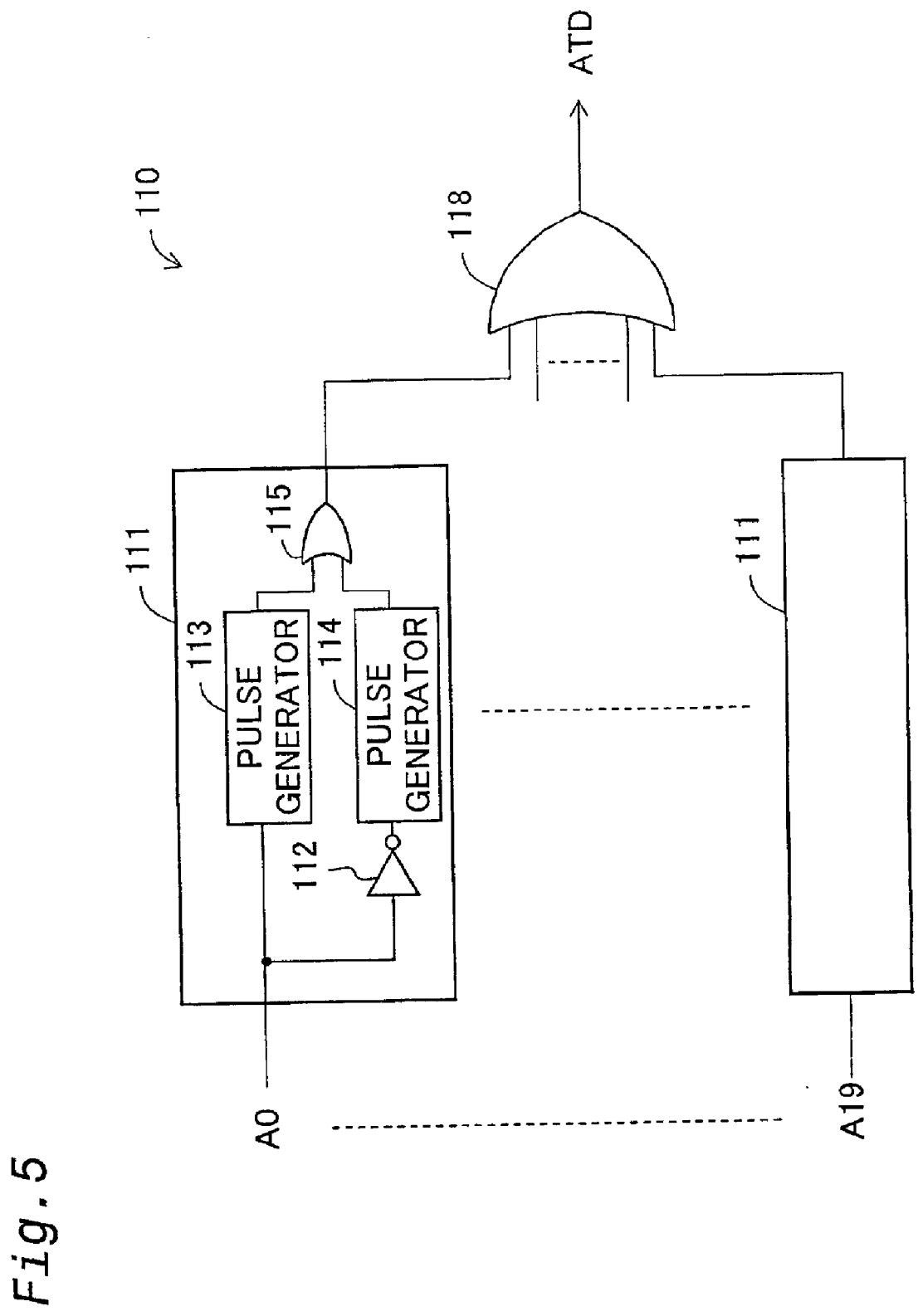
FIG. 5 is a block diagram showing the internal arrangement of ATD circuit 110.

FIG. 5 is a block diagram showing the internal arrangement of ATD circuit 110. ATD circuit 110 comprises 20 transition detection circuits 111—corresponding to the bits of the 20-bit address A0–A19—and a 20-input OR gate 118. Each transition detection circuit 111 has an inverter 112, two pulse generators 113, 114, and an OR gate 115. One-shot multivibrators may be used for the pulse generators 113, 114.

The first pulse generator 113 generates a single pulse of predetermined pulse width according to a rising edge of address bit A0. Inverter 112 and second pulse generator 114 generate a single pulse of predetermined pulse width according to a falling edge of address bit A0. Thus, at each rising edge and falling edge of address bit A0 a single pulse is output from OR gate 115. The procedure is the same for the other address bits A1–A19.

20-input OR gate 118 has as inputs the outputs of the 20 transition detection circuits 111. Thus, any change of one or more bits in 20-bit row address A0–A19 results in a pulsed ATD signal being output from OR gate 118.

The refresh timer 70 shown in FIG. 4 is a circuit that generates a refresh timing signal RFTM according to a predetermined refresh cycle. Refresh timer 70 is composed of a ring oscillator, for example. The refresh cycle is set to about 32 µs, for example.

Refresh request signal generators 50A–50D generate refresh request signals RFREQ0–RFREQ3 for each block 20A–20D in response to a refresh timing signal RTFM supplied by refresh timer 70. These refresh request signals RFREQ0–RFREQ3 are provided respectively to the corresponding block controllers 40A–40D.

Block controllers 40A–40D are supplied with refresh request signals RFREQ0–RFREQ3 as well as with a block address A0–A1 supplied by an external device. Refresh request signals RFREQ0–RFREQ3 indicate that refresh operations should be initiated in the four blocks 20A–20D. In an operating cycle, the block address A0–A1 indicates which of the four blocks 20A–20D external access to is requested. In response to signals RFREQ0–RFREQ3 and A0–A1, block controllers 40A–40D execute arbitration between external access and internal refresh operations for the four blocks. This arbitration is done by setting the output levels of external access signals #EX0–#EX3 and refresh signals #RF0–#RF3.

In response to the levels of external access signals #EX0–#EX3 and refresh signals #RF0–#RF3, row predecoders 30A–30D each select either a row address A8–A19 given from the external device, or a refresh address RFA8–RFA19 given from refresh counter 100, and supply this to a row decoder 24A–24D. Selection of the two kinds of addresses A8–A19 and RFA8–RFA19 is performed independently for each row predecoder. For example, in the event that a request for external access to first block 20A is made at the same time as a refresh request, the first row predecoder 30A selects row address A8–A19 and supplies it to the first block 20A, while the other row predecoders 30B–30D select refresh address RFA8–RFA19 and supply it to the corresponding blocks 20B–20D. Once external access of first block 20A has been completed, first row predecoder 30A supplies the refresh address RFA8–RFA19 to first block 20A.

The design and operation of refresh request signal generators 50A–50D, block controllers 40A–40D, and row predecoders 30A–30D will be discussed more later.

Refresh counter controller 90 detects whether refresh operations for a same given refresh address RFA8–RFA19 have been completed in all four blocks 20A–20D. As will be described later, detection is accomplished by checking for changes in the levels of the four refresh request signals RFREQ0–RFREQ3. When refresh operations in all four blocks 20A–20D have been completed the refresh counter controller 90 supplies a countup signal #CNTUP to refresh counter 100. In response to countup signal #CNTUP, refresh counter 100 then increments by 1 the value of refresh address RFA8–RFA19.

In addition to the circuits depicted in FIG. 4, memory chip 300 also has a controller for controlling the operating mode of circuits in the chip according to chip select signal #CS and snooze signal ZZ, and a controller for controlling I/O status according to the enable signals #WE, #OE, #LB, and #UB; however, for convenience these have been omitted from FIG. 4.

The data I/O buffer 10 and address buffer 60 depicted in FIG. 4 correspond respectively to the "data input/output section" and "address input section" of the invention. Circuits other than data I/O buffer 10, address buffer 60 and memory cell array 20 (i.e. 30A–30D, 40A–40D, 50A–50D, 70, 90, 100, 110, 130) control word line activation in memory cell array 20, and correspond to the "word line activation controller" of the invention.

The word line activation controller functions as a refresh controller for controlling refresh operations of memory cell array 20. In particular, the circuits composed of row predecoders 30A–30D, block controllers 40A–40D, and refresh request signal generators 50A–50D has the function of arbitration circuitry for arbitrating between internal refresh and external access operations.

Figure 6:
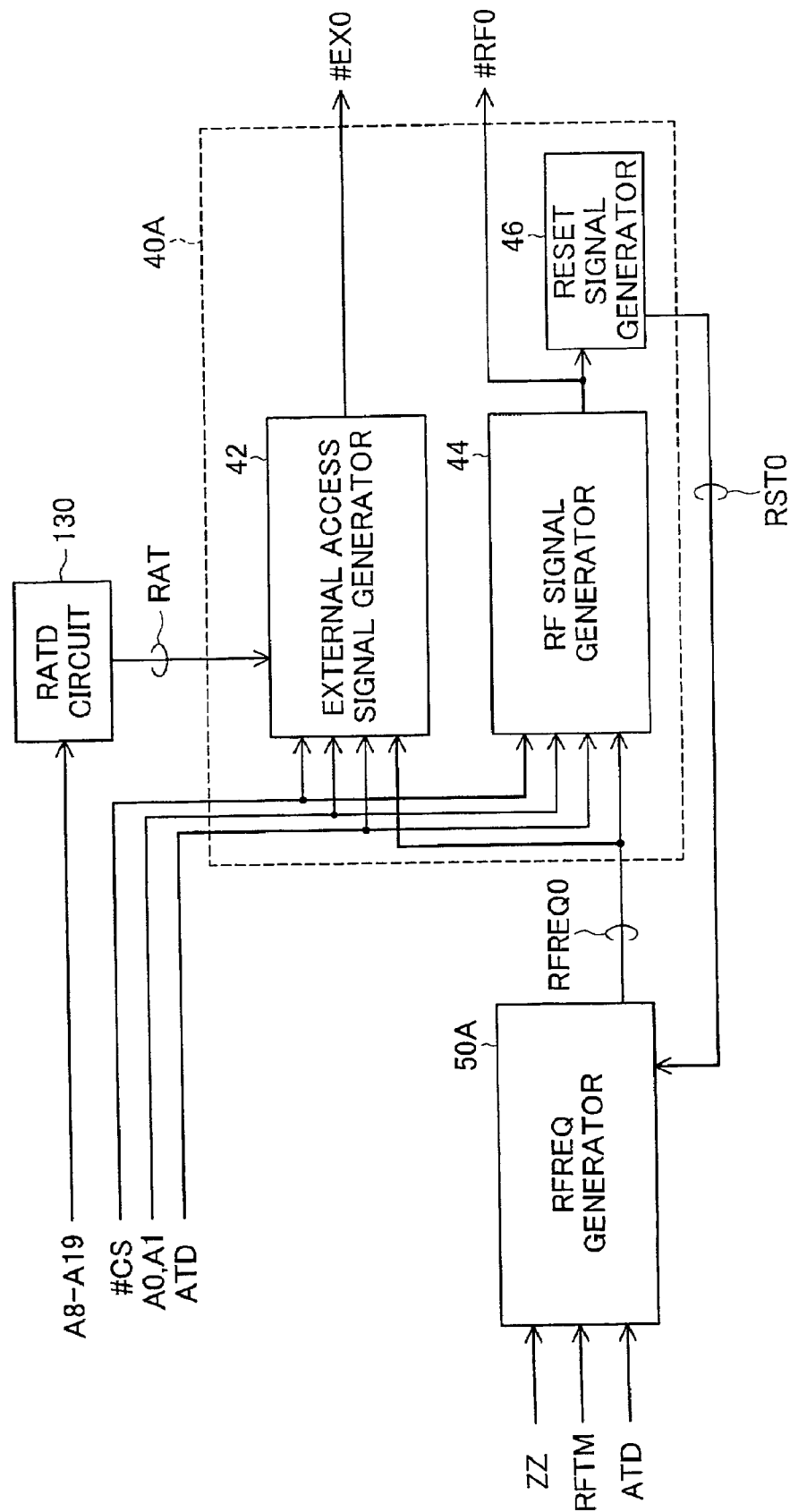
FIG. 6 is a block diagram showing the internal arrangement of first block controller 40A of FIG. 4.

C. Internal Design of Word Line Activation Controller:

FIG. 6 is a block diagram showing the internal arrangement of first block controller 40A of FIG. 4. The other block controllers 40B–40D have the same arrangement shown in FIG. 6.

Block controller 40A comprises an external access signal generator 42 for generating an external access signal #EX0; a refresh signal generator 44 for generating a refresh signal #RF0, and a reset signal generator 46 for generating a reset signal RST0 in response to refresh signal #RF0. External access signal generator 42 and refresh signal generator 44 are each supplied with chip select signal #CS, block address A0–A1, an ATD signal, and a refresh request signal RFREQ0 from refresh request signal generator 50A. External access signal generator 42 is additionally supplied with a row address transition signal RAT (hereinafter "RAT signal") from the row address transition detection circuit (hereinafter "RATD circuit") 130.

Refresh request signal generator 50A has as inputs the snooze signal ZZ, refresh timing signal RFTM, and ATD signal. When snooze signal ZZ is L level (i.e. in snooze mode), refresh request signal generator 50A immediately brings refresh request signal RFREQ0 up to H level according to a rising edge of refresh timing signal RFTM. When snooze signal ZZ is H level (i.e. in an operation or standby cycle), on the other hand, refresh request signal RFREQ0 rises to H level according to a rising edge of the ATD signal issued after the refresh timing signal RFTM has risen.

Row address transition detection circuit (RATD circuit) 130 detects whether there has been any change of any one or more bits in the 12-bit row input address A8–A19 supplied by an external device, and if it detects a change, outputs a RAT signal. RATD circuit 130 has a similar arrangement to the ATD circuit 110 depicted in FIG. 5; the RATD circuit 130 has as input only the row input address A8–A19 of the address A0–A19. As shown in FIG. 4, this RAT signal is supplied to the four block controllers 40A–40D.

Figure 7:
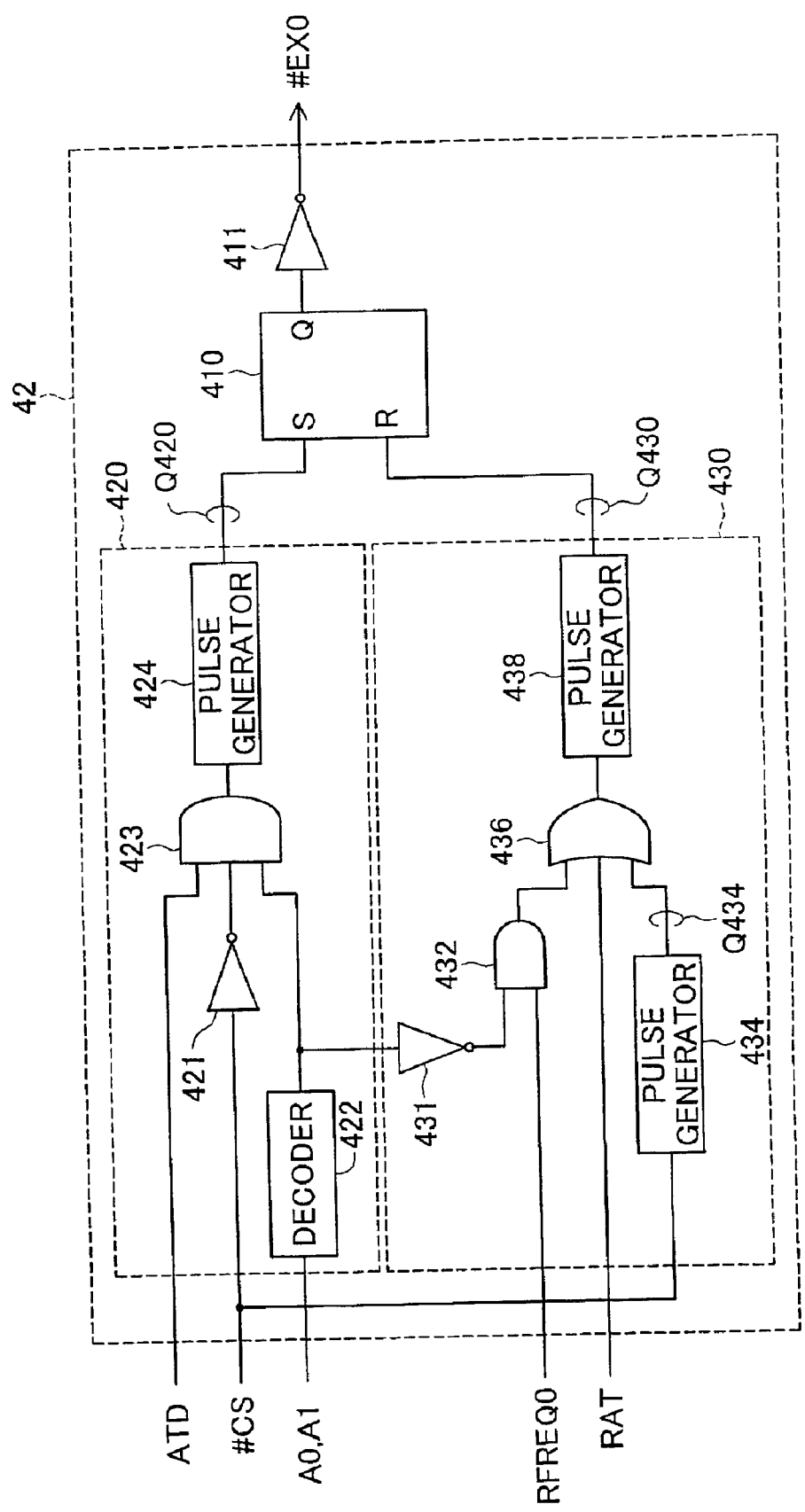
FIG. 7 is a block diagram of the internal arrangement of the external access signal generator 42 of FIG. 6.

FIG. 7 is a block diagram of the internal arrangement of the external access signal generator 42 of FIG. 6. External access signal generator 42 comprises an RS latch 410, an inverter 411, a set signal generator 420, and a reset signal generator 430. The output signal Q420 from set signal generator 420 is given to the set terminal S of RS latch 410, and the output signal Q430 from reset signal generator 430 is given to the reset terminal R of RS latch 410.

Set signal generator 420 comprises an inverter 421, a decoder 422, a 3-input AND gate 423, and a pulse generator 424. The output of decoder 422 goes to H level when the value of the supplied block address A0–A1 is "0"— indicating the first block 20A—and is L level at other times. The 3-input AND gate 426 has as inputs the ATD signal, a chip select signal #CS inverted by inverter 421, and the output signal from decoder 422. The output of AND gate 423 is given to pulse generator 424.

In sync with the ATD signal, the set signal generator 420 determines whether there has been a request for external access to the first block 20A associated with first block controller 40A. Specifically, when chip select signal #CS is L level (active) and the block address A0–A1 value is "0", set signal generator 420 determines that there is a request for external access to block 20A, and supplies a pulse signal Q420 to the set terminal S of RS latch 410. In response to pulse signal Q420, RS latch 410 and inverter 411 set the external access signal #EX0 to active (L level). When the external access signal #EX0 is active (L level), the word line selected by row address A8–A19 in block 20A (FIG. 4) is activated, and external access is performed.

Reset signal generator 430 comprises an inverter 431, an AND gate 432, a 3-input OR gate 436, and two pulse generators 434, 438. AND gate 432 is supplied with the output signal of decoder 422 inverted by inverter 431, and with refresh request signal RFREQ0. First pulse generator 434 generates a pulse at the rising edge of chip select signal #CS. The 3-input OR gate 436 has as inputs the output signal of AND gate 432, the RAT signal, and the output signal of first pulse generator 434. The output of OR gate 436 is given to the second pulse generator 438.

Reset signal generator 430 supplies a pulse signal Q430 to the reset terminal R of RS latch 410 in the following instances: (1) there is a refresh request, but no external access request, for first block 20A; (2) row address A8–A19 has changed; or (3) chip select signal #CS has gone to H level (inactive). In response to pulse signal Q430, RS latch 410 and inverter 411 set the external access signal #EX0 to inactive (H level).

The refresh signal generator 44 of FIG. 6 also determines whether there has been a request for external access to the first block 20A, and sets the state (level) of refresh signal #RF0 accordingly. Specifically, in the event of a refresh request in the absence of an external access request to first block 20A, it sets refresh signal #RF0 to active (L level). When refresh signal #RF0 goes to active (L level), the word line in block 20A (FIG. 4) indicated by the refresh address RFA8–RFA19 is activated and all of the memory cells on the word line are refreshed. In the absence of both an external access request to first block 20A and a refresh request, refresh signal #RF0 is set to inactive (H level).

In the event that there is an external access request to block 20A, refresh signal #RF0 is set to inactive (H level) even if there is also a refresh request. Refresh signal #RF0 is subsequently held inactive (H level) until external access of block 20A is completed, and is set to active (L level) when external access of block 20A is completed. The refresh operation in block 20A is initiated once refresh signal #RF0 goes to active (L level).

The reset signal generator 46 of FIG. 6 issues a short-pulse reset signal RST0 according to a rising edge of refresh signal #RF0. This reset signal generator 46 is composed of a one-shot multivibrator, for example. In response to a reset signal RST0 supplied by reset signal generator 46, refresh request signal generator 50A returns refresh request signal #RFREQ0 to L level. This cancels the refresh request for block 20A.

Operation of block controller 40A will be discussed more hereinafter.

External access signals #EX0 and refresh signals #RF0 output by block controller 40A (FIG. 6) are supplied to a row predecoder 30A (FIG. 4) in block 20A.

Figure 8:
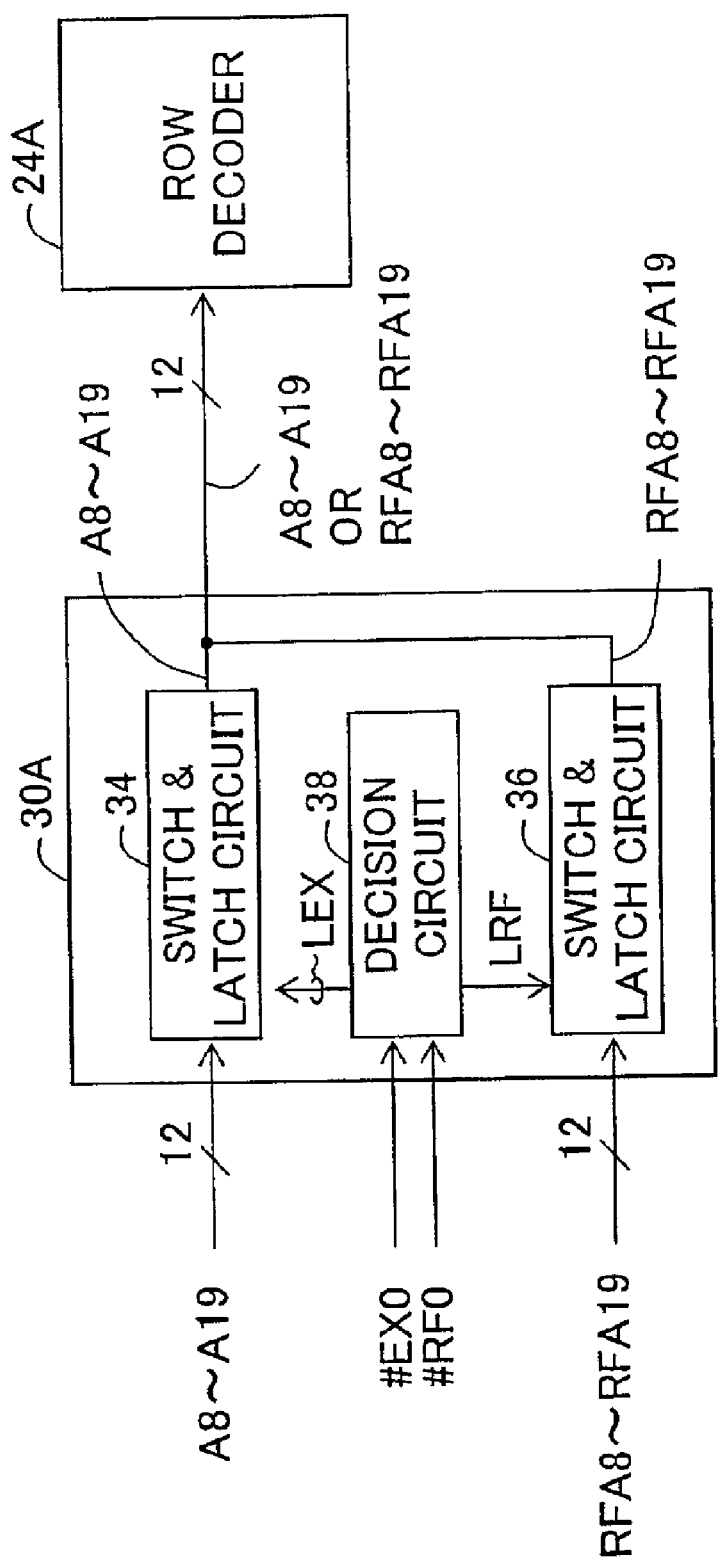
FIG. 8 is a block diagram of the internal arrangement of the first row predecoder 30A of FIG. 4.

FIG. 8 is a block diagram of the internal arrangement of the first row predecoder 30A of FIG. 4. Row predecoder 30A comprises two switch & latch circuits 34, 36 and a decision circuit 38. The other row predecoders 30B–30D have the same arrangement as in FIG. 8.

Decision circuit 38 is supplied with external access signal #EX0 and the refresh signal #RF0 from block controller 40A. Decision circuit 38 supplies a control signal LEX to first switch & latch circuit 34 in response to an external access signal #EX0, and supplies a control signal LRF to second switch & latch circuit 36 in response to a refresh signal #RF0.

When external access signal #EX0 is active (L level), the first switch & latch circuit 34, in response to control signal LEX, latches the row address A8–A19 supplied to it by the external device and supplies this to row decoder 24A in first block 20A. During this time output by the second switch & latch circuit 36 is disabled by control signal LRF.

On the other hand, when refresh signal #RF0 is active (L level), second switch & latch circuit 36, in response to control signal LRF, latches the refresh address RFA8–RFA19 supplied to it by refresh counter 100 (FIG. 4) and supplies this to row decoder 24A. During this time output by first switch & latch circuit 34 is disabled by control signal LEX.

Block controller 40A (FIG. 6) is designed such that the two signals #EX0, #RF0 are never active (L level) at the same time. When both signals #EX0, #RF0 are inactive (H level), row predecoder 30A does not supply addresses A8–A19, RFA8–RFA19 to row decoder 24A.

In this way, in response to the levels of the two signals #EX0, #RF0, row predecoder 30A selects and supplies either the row address A8–A19 or the refresh address RFA8–RFA19, and supplied it to the row decoder 24A in block 20A (FIG. 4). When row decoder 24A is supplied with a row address A8–A19 or refresh address RFA8–RFA19 by row predecoder 30A, it activates the one word line selected by the row address A8–A19 or the refresh address RFA8–RFA19 for block 20A.

D. Operation of Word Line Activation Controller:

D1. Operation during operation cycle (with no refresh request):

FIGS. 9(a)–9(n) are timing charts showing operation of first block controller 40A (FIG. 6) during operation cycles. In an operation cycle, chip select signal #CS (FIG. 9(b)) is L level (active) and snooze signal ZZ (FIG. 9(c)) is H level. ATD signal (FIG. 9(a)) rises at times t1–t7; there are seven consecutive operation cycles, initiated at each of these times.

FIGS. 9(a)–9(n) show operation in the absence of a refresh request during the operation cycle, namely, in the absence of a rising edge in the refresh timing signal RFTM (FIG. 9(k)) given to the refresh request signal generator 50A of FIG. 6. Here, the refresh request signal REFEQ0 (FIG. 9(l)) given to the refresh signal generator 44 in first block controller 40A is L level. Accordingly, the refresh signal #RF0 (FIG. 9(m)) output from refresh signal generator 44 remains at H level (inactive), and the reset signal RST0 (FIG. 9(n)) output by reset signal generator remains at L level.

In a first cycle beginning at time t1 the value of block address A0–A1 (FIG. 9(d)) is "0" and external access to first block 20A is requested. The set signal generator 420 of FIG. 7 therefore outputs a pulse signal Q420 (FIG. 9(f)) at time t1. In response to pulse signal Q420, RS latch 410 and inverter 411 set the external access signal #EX0 (FIG. 9(j)) to L level (active).

In a second cycle beginning at time t2 the value of block address A0–A1 changes from "0" to "1"—indicating the second block 20B—and there is no request for external access to first block 20A. The value of row address A8–A19 (FIG. 9(e)) changes from "p" to "q". The RATD circuit 130 of FIG. 6 therefore detects the change in the row address at time t2 and outputs a RAT signal (FIG. 9(g)). In response to the RAT signal the reset signal generator 430 of FIG. 7 outputs a pulse signal Q430 (FIG. 9(i)). In response to pulse signal Q430, RS latch 410 and inverter 411 set the external access signal #EX0 (FIG. 9(j)) to H level (inactive).

In a third cycle beginning at time t3 the value of block address A0–A1 changes to "0" and there is a request for external access to first block 20A. The value of row address A8–A19 remains "q". Here, as in the first cycle, a pulse signal Q420 is output, so the external access signal #EX0 is set to L level (active).

In a fourth cycle beginning at time t4 the value of block address A0–A1 changes to "1" and there is no request for external access to first block 20A. However, as the value of row address A8–A19 remains unchanged at "q", the RAT signal does not pulse. Accordingly, RS latch 410 and inverter 411 hold the external access signal #EX0 at L level (active).

In a fifth cycle beginning at time t5 the value of block address A0–A1 changes to "0" and there is a request for external access to first block 20A. As in the first and third cycles, a pulse signal Q420 is output, but since external access signal #EX0 is already at L level (active) it remains at L level.

In a sixth cycle beginning at time t6 the value of block address A0–A1 remains at "0" and there is a request for external access to first block 20A. The value of row address A8–A19 changes from "q" to "r". As in the second cycle, a RAT signal is output, so external access signal #EX0 is set to H level (inactive). As in the first and third cycles, a pulse signal Q420 is output, so external access signal #EX0 is again set to L level (active).

In a seventh cycle beginning at time t7 the value of block address A0–A1 changes to "2"—indicating the third block 20C—and there is no request for external access to first block 20A. However, the value of row address A8–A19 remains "r". Thus, as in the fourth cycle, the external access signal #EX0 remains at L level (active).

Before time t8, the chip select signal #CS rises to H level (inactive). At this point the first pulse generator 434 in the reset signal generator 430 of FIG. 7 outputs a pulse signal Q434 (FIG. 9(h)), so reset signal generator 430 outputs pulse signal Q430. In response thereto, external access signal #EX0 is set to H level (inactive).

In response to a request for external access to first block 20A, as in the third cycle in FIGS. 9(a)–9(n), first block controller 40A sets the external access signal #EX0 to L level (active). As in the third to fifth cycles, after the first block controller 40A sets the external access signal #EX0 to L level (active), it is held at L level until there is a change in the row address A8–A19 of the addresses A0–A19 used in subsequent cycles.

Figure 9:
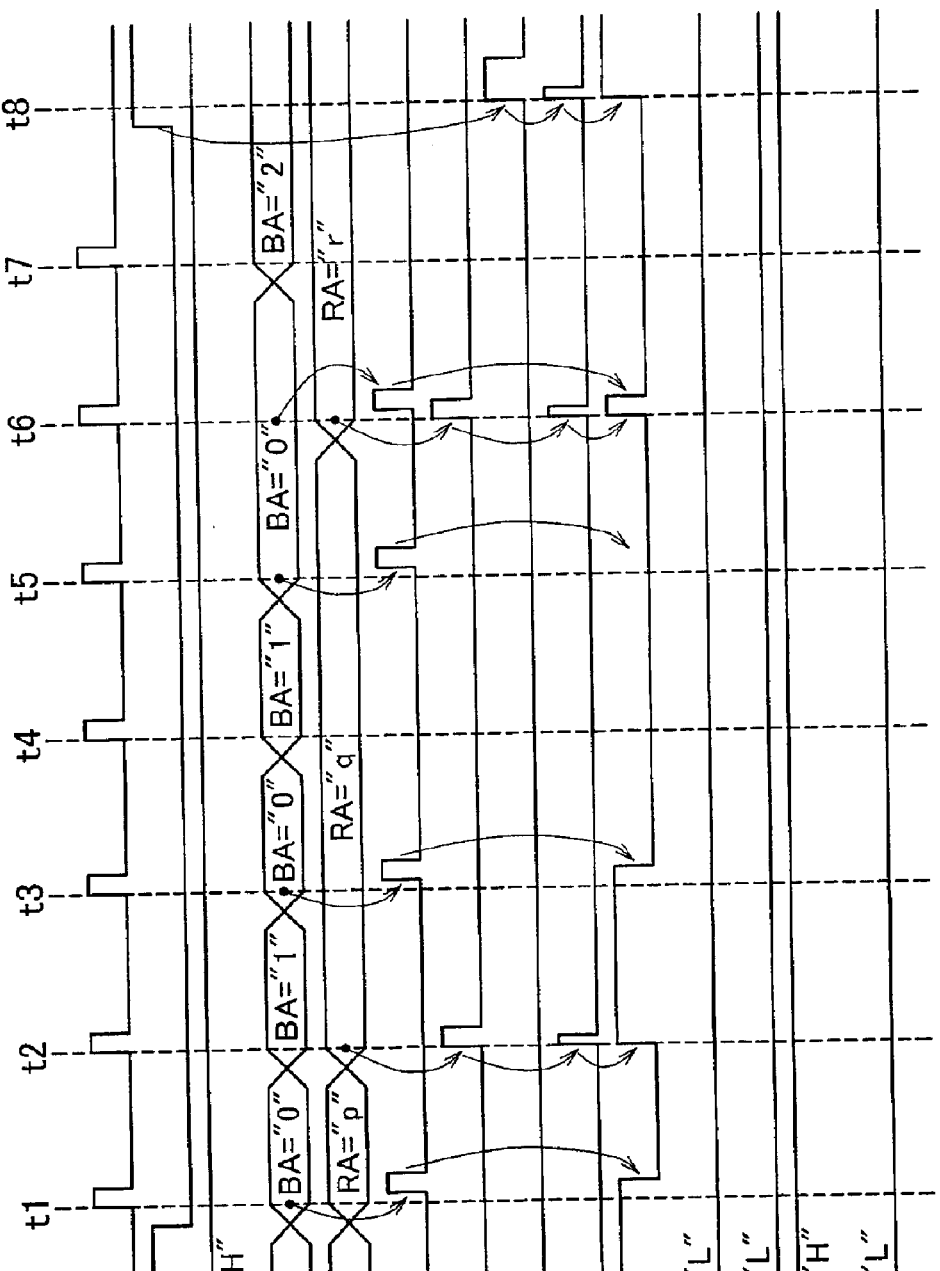
FIGS. 9(a)–9(n) are timing charts showing operation of first block controller 40A (FIG. 6) during operation cycles.
Figure 10:
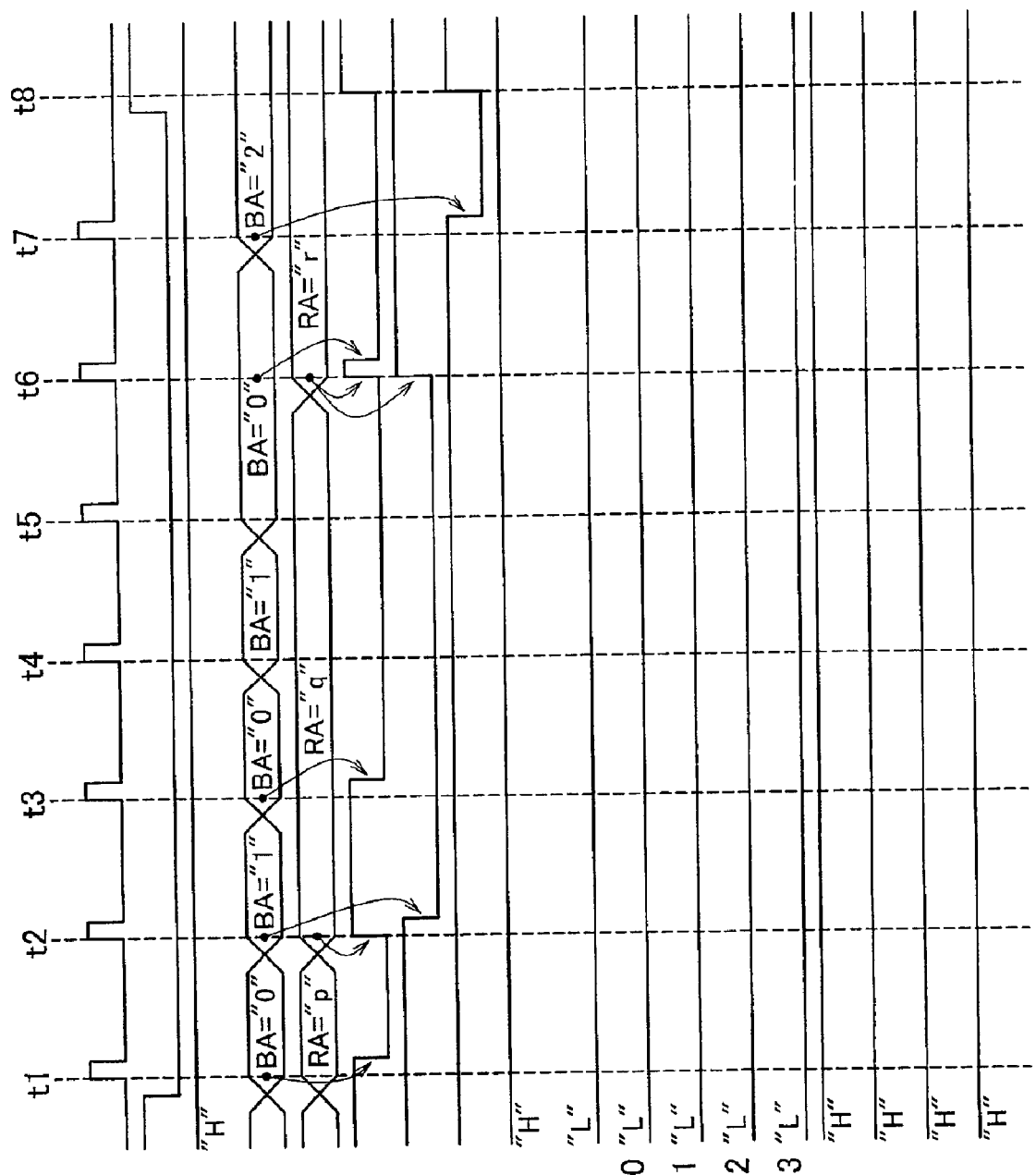
FIGS. 10(a)–10(r) are timing charts showing operation of the block controllers 40A–40D during the operation cycles shown in FIGS. 9(a)–9(n)

FIGS. 10(a)–10(r) are timing charts showing operation of the block controllers 40A–40D during the operation cycles shown in FIGS. 9(a)–9(n). FIGS. 10(a)–10(e) are analogous to FIGS. 9(a)–9(e). Since the absence of a refresh request is assumed, the refresh timing signal RFTM (FIG. 10(j)) is the same as in FIG. 9(k). Accordingly, the refresh request signals REFEQ0–REFEQ3 (FIGS. 10(k)–10(n)) given to block controllers 40A–40D and the refresh signals #RF0–#RF3 (FIGS. 10(o)–10(r)) output by block controllers 40A–40D have the same signal levels as those in FIGS. 9(l) and 9(m), respectively.

FIGS. 10(f)–10(i) show the external access signals #EX0–#EX3 output by block controllers 40A–40D. FIG. 10(f) is the same as in FIG. 9(j).

As shown in the figure, in the second cycle the value of block address A0–A1 changes to "1"—indicating the second block 20B—and there is a request for external access to second block 20B. Accordingly the second block controller 40B sets the external access signal #EX1 (FIG. 10(g)) to L level (active). The value "p" of the row address A8–A19 used in the second cycle remains unchanged at "p" up to the fifth cycle, so the second block controller 40B holds external access signal #EX1 at L level (active) over the four cycles beginning at time t2. In the third and fifth cycles, external access signal #EX1 is held at L level (active), but external access to second block 20B is not requested.

In the seventh cycle, the value of block address A0–A1 changes to "2"—indicating the third block 20C—so the third block controller 40C sets the external access signal #EX2 (FIG. 10(h)) to L level (active).

As shown in the second to sixth cycles in FIGS. 10(a)–10(r), even when one of the external access signals has been set to L level (active) (FIG. 10(g)), block controllers 40A–40D can cause the other external access signals to be set to L level (active) as well (FIG. 10(f)). Once an external access signal has been set to L level (active), it is held at L level (active) until there is a change in the row address A8–A19 in the addresses A0–A19 used in subsequent cycles.

If there is a request for external access to the third block 20C in the fourth cycle in FIGS. 10(a)–10(r), the third external access signal #EX3 is also set to L level (active), and remains at L level (active) until there is a change in the row address A8–A19.

FIGS. 11(a)–11(q) are timing charts showing word line status during the operation cycles shown in FIGS. 10(a)–10(r). FIGS. 11(a)–11(e) are analogous to FIGS. 10(a)–10(e), FIGS. 11(f)–11(i) are analogous to FIGS.10(f)–10(i), and FIGS. 11(j)–11(m) are analogous to FIGS. 10(o)–10(r).

Word line status in subarrays 22A–22D in blocks 20A–20D (FIG. 4) is shown in FIGS. 11(n)–11(q). Each subarray includes a plurality of word lines, however two or more word lines are not activated simultaneously in the same subarray. In FIG. 11(n), for example, different word lines activated in sequence in subarray 22A are shown on the same timing chart. Word lines WLp, WLq and WLr rising to H level indicate the different activated word lines.

FIGS. 12(A)–12(G) are schematic representations of activated word lines in subarrays 22A–22D during each operation cycle in FIGS. 11(a)–11(q). FIGS. 12(A)–12(G) show the status of subarrays 22A–22D during first to seventh operation cycles beginning at times t1–t7 in FIGS. 11(a)–11(q). Activated word lines in subarrays 22A–22D are indicated by horizontal lines. Vertical lines in subarrays 22A–22D indicate bit line pairs; subarrays containing both word lines and bit line pairs are subject to external access of memory cells (indicated by a circle) equivalent to one word selected by the word line and bit line pair.

As shown in FIGS. 11(f)–11(i), in the first cycle only the first external access signal #EX0 is set to L level (active). Thus, in the first cycle, only the "p"th word line WLp selected by row address A8–A19 (FIG. 11(e)) in first subarray 22A is activated, while word lines in other subarrays 22B–22D are not activated, as shown in FIGS. 11(n)–11(p) and FIG. 12(A). Since in the first cycle there is a request for external access to first block 20A (FIG. 11(d)), external access of memory cells in first subarray 22A is executed (FIG. 12(A)).

In the second cycle, only the second external access signal #EX1 is set to L level (active). Thus, in the second cycle, the "p"th word line WLp in first subarray 22A is deactivated, and only the "q"th word line WLq in second subarray 22B is activated, as shown in FIGS. 11(n)–11(p) and FIG. 12(B). Since in the second cycle there is a request for external access to second block 20B, external access of memory cells in second subarray 22B is executed (FIG. 12(B)).

In the third cycle, with the second external access signal #EX1 held at L level (active), the first external access signal #EX0 is also set to L level (active). Thus, in the third cycle the "q"th word line WLq in second subarray 22B remains activated while the "q"th word line WLq in first subarray 22A is activated as well, as shown in FIGS. 11(n)–11(p) and FIG. 12(C). Since in the third cycle there is a request for external access to first block 20A, external access of memory cells in first subarray 22A is executed, while no external access is performed on memory cells in second subarray 22B (FIG. 12(C)).

In the fourth and fifth cycles both external access signals #EX0, #EX1 remain at H level (active). Thus, in the fourth and fifth cycles the "q"th word lines WLq in the two subarrays 22A, 22B remain activated as shown in FIGS. 11(n)–11(p) and FIGS. 12(D), 12(E). In the fourth cycle, however, only memory cells in the second subarray 22B are externally accessed (FIG. 12(D)), and in the fifth cycle only memory cells in the first subarray 22A are externally accessed (FIG. 12(E)).

In the sixth cycle, only the first external access signal #EX0 is set to L level (active). Thus, in the sixth cycle, the "q"th word lines WLq in two subarrays 22A, 22B are deactivated, and only the "r"th word line WLr in first subarray 22A is activated, as shown in FIGS. 11(n)–11(p) and FIG. 12(F). In the sixth cycle memory cells in first subarray 22A are externally accessed (FIG. 12(F)).

In the seventh cycle, as in the fourth cycle, the third external access signal #EX2 is set to L level (active) in addition to the first external access signal #EX0. Thus, in the seventh cycle the "r"th word line WLr in first subarray 22A remains activated while the "r"th word line WLr in third subarray 22C is activated as well, as shown in FIGS. 11(n)–11(p) and FIG. 12(G). In the seventh cycle only memory cells in third subarray 22C are externally accessed (FIG. 12(G)).

As described in FIGS. 9(a)–9(n) through 12(A)–12(G), when external access of a certain block is requested, block controllers 40A–40D set the external access signal for the corresponding block to active. The word line selected by the row address—in the corresponding block is activated and memory cells on the activated word line are externally accessed. Once an external access signal has been set to active (L level), block controllers 40A–40D continue to hold the signal at L level until there is a change in the row address A8–A19 in a subsequent address A0–A19. The word line is held in the activated state, enabling external access of memory cells on the activated word line in subsequent cycles in which there is another request for external access to the block. This obviates the need to repeatedly activate and deactivate word lines in each cycle, considerably reducing power consumption.

In this way, when consecutive operation cycles employing addresses that contain the same row address, the word line activation controller in the present embodiment can maintain in the activated state a word line in a first memory cell block activated during the initial cycle, without deactivating it until the final cycle.

At the same time, the word line activation controller can maintain in the activated state a word line in a second memory cell block activated in some cycle coming after the initial cycle and up through the final cycle, without deactivating it until the final cycle. Where word lines in two or more blocks are held in the activated state at the same time, the frequency of external access of memory cells on the activated word lines can be increased, thereby considerably reducing the power consumption associated with activation of word lines.

In the present embodiment the row address is assigned to the uppermost plurality of bits of a 20-bit address, so the row address is relatively less likely to change. In this way the frequency with which word lines can be held in the activate state can be increased, thereby further reducing the power consumption associated with activation of word lines.

D2. Operation During Operation Cycle (with a Refresh Request):

FIGS. 13(a)–13(o) are timing charts showing operation of first block controller 40A (FIG. 6) during an operation cycle in which there is a refresh request, and correspond to FIGS. 9(a)–9(n). FIGS. 13(a)–13(o) show operation in the event a refresh request is made during the seven consecutive operation cycle periods of FIGS. 9(a)–9(n). FIGS. 13(a)–13(h) are analogous to FIGS. 9(a)–9(h).

As shown in FIG. 13(k), during the second cycle period the refresh timing signal RFTM rises to H level. The refresh request signal generator 50A (FIG. 6) sets the refresh request signal RFREQ0 (FIG. 13(l)) to H level in sync with the next rising edge of the ATD signal (FIG. 13(a)) (time t3) to request a refresh operation for the first block 20A. As noted, refresh request signal RFREQ0 is held at H level until the refresh operation in the first block 20A is completed.

In the third cycle, the refresh request signal RFREQ0 is set at H level indicating a request for a refresh operation on first block 20A, but the value of block address A0–A1 is "0", indicating a request for external access to first block 20A. In this case, external access signal #EX0 (FIG. 13(j)) is set to L level (active), and an external access operation—assigned priority—is performed in first block 20A.

In the fourth cycle the value of block address A0–A1 changes to "1", and there is no request for external access to first block 20A. Also in the fourth cycle the refresh request signal RFREQ0 continues to be held at H level, and there is a request for a refresh operation on the first block 20A. In this case the output of the AND gate 432 in the reset signal generator 430 of FIG. 7 goes to H level, so reset signal generator 430 outputs a pulse signal Q430 (FIG. 13(i)). In response to pulse signal Q430, RS latch 410 and inverter 411 set external access signal #EX0 to H level (inactive).

In the fourth cycle, while there is no request for external access to first block 20A, there is a request for a refresh operation, and so the refresh signal generator 44 of FIG. 6 sets the refresh signal #RF0 (FIG. 13(m)) to L level (active).

At this time the first row predecoder 30A of FIG. 8 selects the refresh address RFA8–RFA19 and supplies it to the first row decoder 24A. Thus, in first block 20A the "n"th word line selected by refresh address RFA8–RFA19 (FIG. 13(o)) is activated, and a refresh operation is performed on all memory cells on the word line.

In the fourth cycle, when sufficient time has elapsed for the refresh operation to be completed, refresh signal generator 44 brings refresh signal #RF0 up to H level (inactive). In response to the rising edge of refresh signal #RF0, reset signal generator 46 issues a short-pulse reset signal RST0 (FIG. 13(n)). In response to reset signal RST0, the refresh request signal generator 50A (FIG. 6) returns the refresh request signal RFREQ0 to L level. This completes the refresh operation of the first block 20A.

In the fifth cycle, the value of block address A0–A1 changes to "0", so external access signal #EX0 is again set to L level (active).

As will be apparent from comparison of FIGS. 13(a)–13(o) with FIGS. 9(a)–9(n), in the absence of an external access request and the presence of a refresh request, first block controller 40A will set external access signal #EX0 to H level (inactive), even in the absence of a change in row address A8–A19.

FIGS. 14(a)–14(t) are timing charts of operation of block controllers 40A–40D during the operation cycles shown in FIGS. 13(a)–13(o), and correspond to FIGS. 10(a)–10(r). FIGS. 14(a)–14(e) are analogous to FIGS. 13(a)–13(e). The refresh timing signal RFTM in FIG. 14(j) is analogous to that in FIG. 13(k), and the signals #EX0 (FIG. 14(f)), RFREQ0 (FIG. 14(k)) and #RF0 (FIG. 14(o)) for first block controller 40A are analogous to those in FIGS. 13(j), 13(l) and 13(m).

When the refresh timing signal RFTM (FIG. 14(j)) rises to H level in the second cycle period, in the third cycle all of the refresh request signals RFREQ0–RFREQ3 (FIGS. 14(k)–14(n)) are set to H level to request refresh operations for blocks 20A–20D.

In the third cycle, there is a request for external access to the first block 20A, whereupon prioritized external access is performed in first block 20A, as described earlier with reference to FIGS. 13(a)–13(o). For the other three blocks 20B–20D, on the other hand, as there are no requests for external access, refresh operations are performed on the three blocks 20B–20D. That is, in the third cycle the three external access signals #EX1–#EX3 (FIGS. 14(g)–14(i)) are set to H level (inactive) and the three refresh signals #RF1–#RF3 (FIGS. 14(p)–14(r)) are set to L level (active). Also in the third cycle the "n"th word line—selected by refresh address RFA8–RFA19 (FIG. 14(t))—in each of the three blocks 20B–20D is activated, and all memory cells on the word line are refreshed. When refresh signals #RF1–#RF3 subsequently rise to H level, refresh request signals RFREQ1–RFREQ3 return to L level, completing refresh operations for the three blocks 20B–20D.

In the fourth cycle, there is request for external access to the second block 20B, and so the second external access signal #EX1 (FIG. 14(g)) is again set to L level (active).

As described with reference to FIGS. 13(a)–13(o) and 14(a)–14(t), refresh operations in each block 20A–20D are performed in accordance with the same given refresh address RFA8–RFA19 (FIG. 14(t)). That is, when refresh address RFA8–RFA19 assumes a value of "n" the "n"th word line in each block 20A–20D is activated, and all memory cells on the "n"th word line are refreshed. The refresh operation on first block 20A is performed during the fourth cycle, and the refresh operation on the other blocks 20B–20D is performed during the third cycle, each block being refreshed during the course of one cycle period.

When refresh operations on each block 20A–20D are completed, refresh request signals RFREQ0–RFREQ3 (FIGS. 14(k)–14(n)) return to L level. When all refresh request signals RFREQ0–RFREQ3 have returned to L level, the refresh counter controller 90 in FIG. 4 issues a countup signal #CNTUP (FIG. 14(s)).

Figure 14:
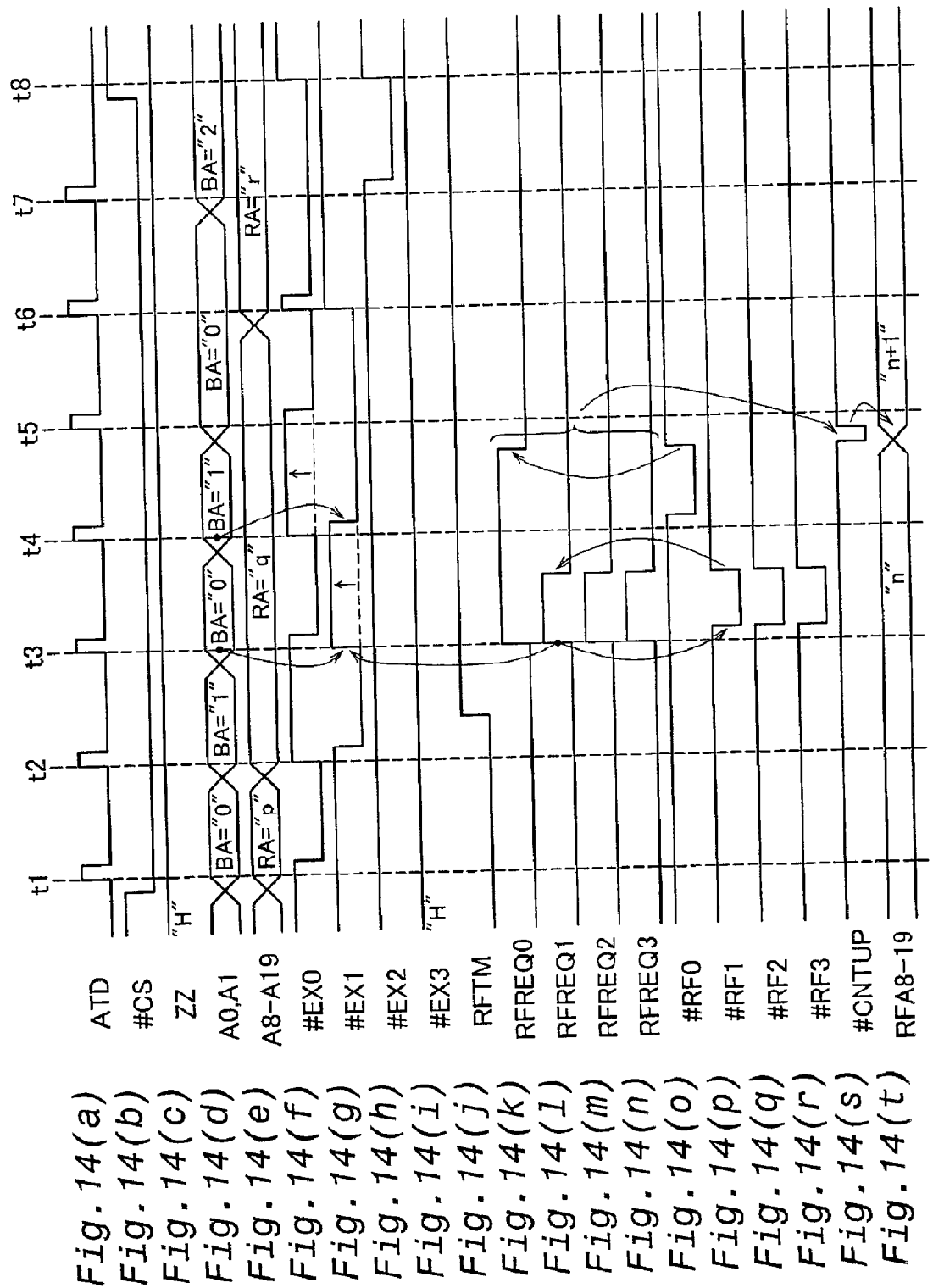
FIGS. 14(a)–14(t) are timing charts of operation of block controllers 40A–40D during the operation cycles shown in FIGS. 13(a)–13(o); correspond to FIGS. 10(a)–10(r)
Figure 15:
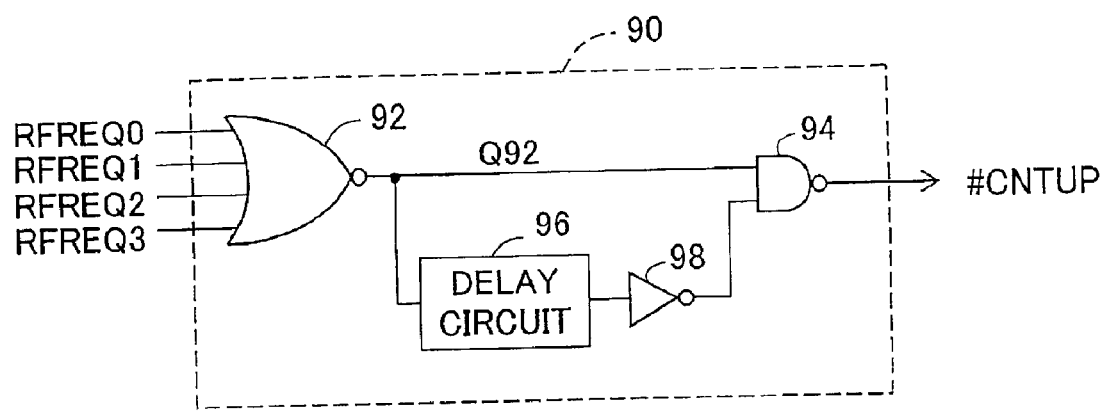
FIG. 15 is a block diagram of the internal arrangement of the refresh counter controller 90 of FIG. 4.

FIG. 15 is a block diagram of the internal arrangement of the refresh counter controller 90 of FIG. 4. Refresh counter controller 90 comprises a 4-input NOR gate 92, a NAND gate 94, a delay circuit 96, and an inverter 98. The 4-input NOR gate 92 has as inputs the four refresh request signals RFREQ0–RFREQ3. The output Q92 of the 4-input NOR gate 92 is given to one of the input terminals of the NAND gate 94. Output Q92 is also given to the other terminal of the NAND gate 94, after being delayed by the delay circuit 96 and inverted by the inverter 98. As will be apparent from this arrangement, the countup signal #CNTUP output from NAND gate 94 is a pulse signal (FIG. 14(s)) that goes to L level after the four refresh request signals RFREQ1–RFREQ3 drop to L level, and the pulse signal is held at L level during a delay period produced by delay circuit 96

In response to countup signal #CNTUP, refresh counter 100 (FIG. 4) increments by 1 the refresh address RFA8–RFA19 (FIG. 14(*t*)). Accordingly, the next refresh operation is performed on the "n+1"th word line.

Figure 11:
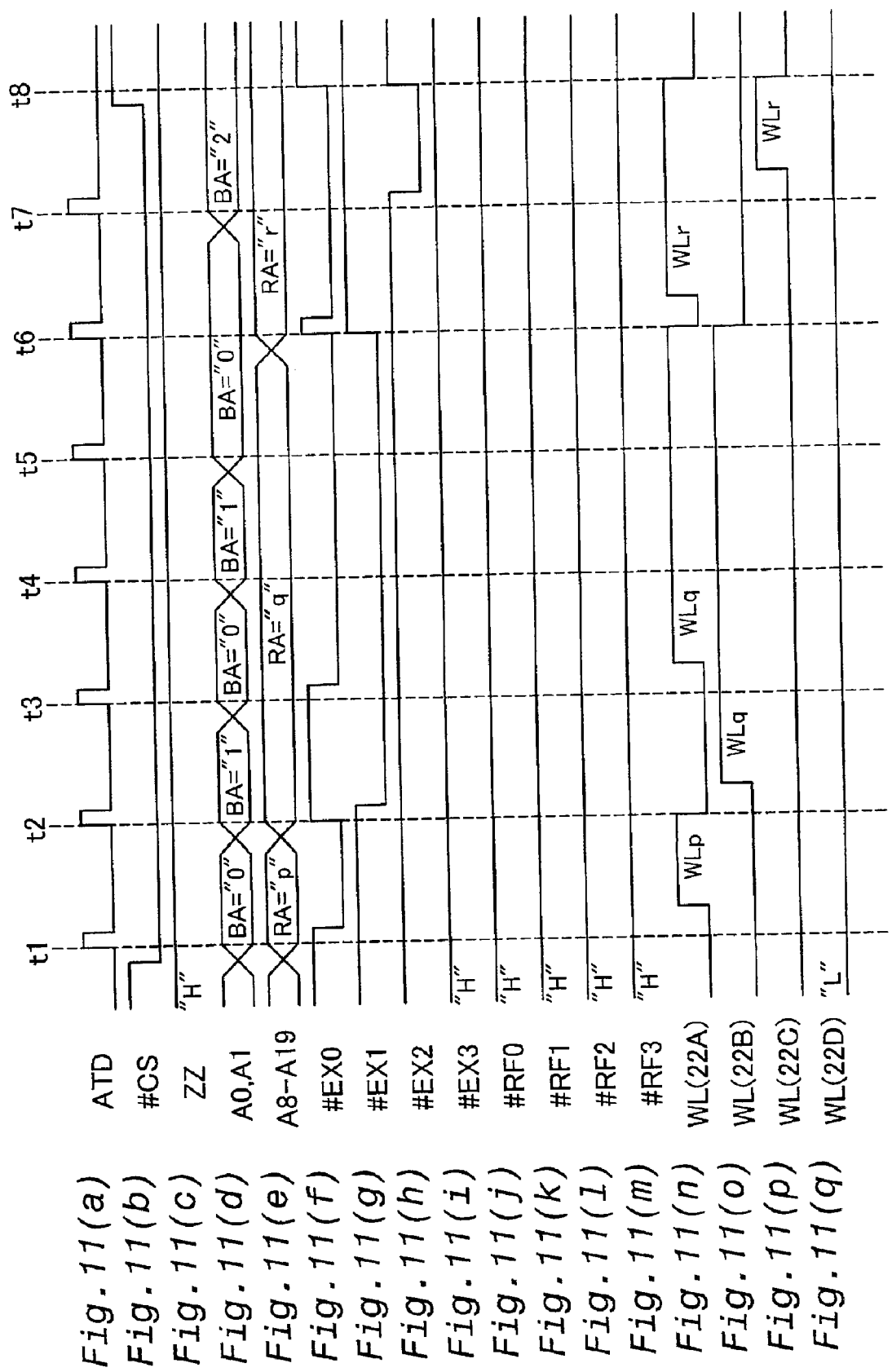
FIGS. 11(a)–11(q) are timing charts showing word line status during the operation cycles shown in FIGS. 10(a)–10(r)
Figure 12:
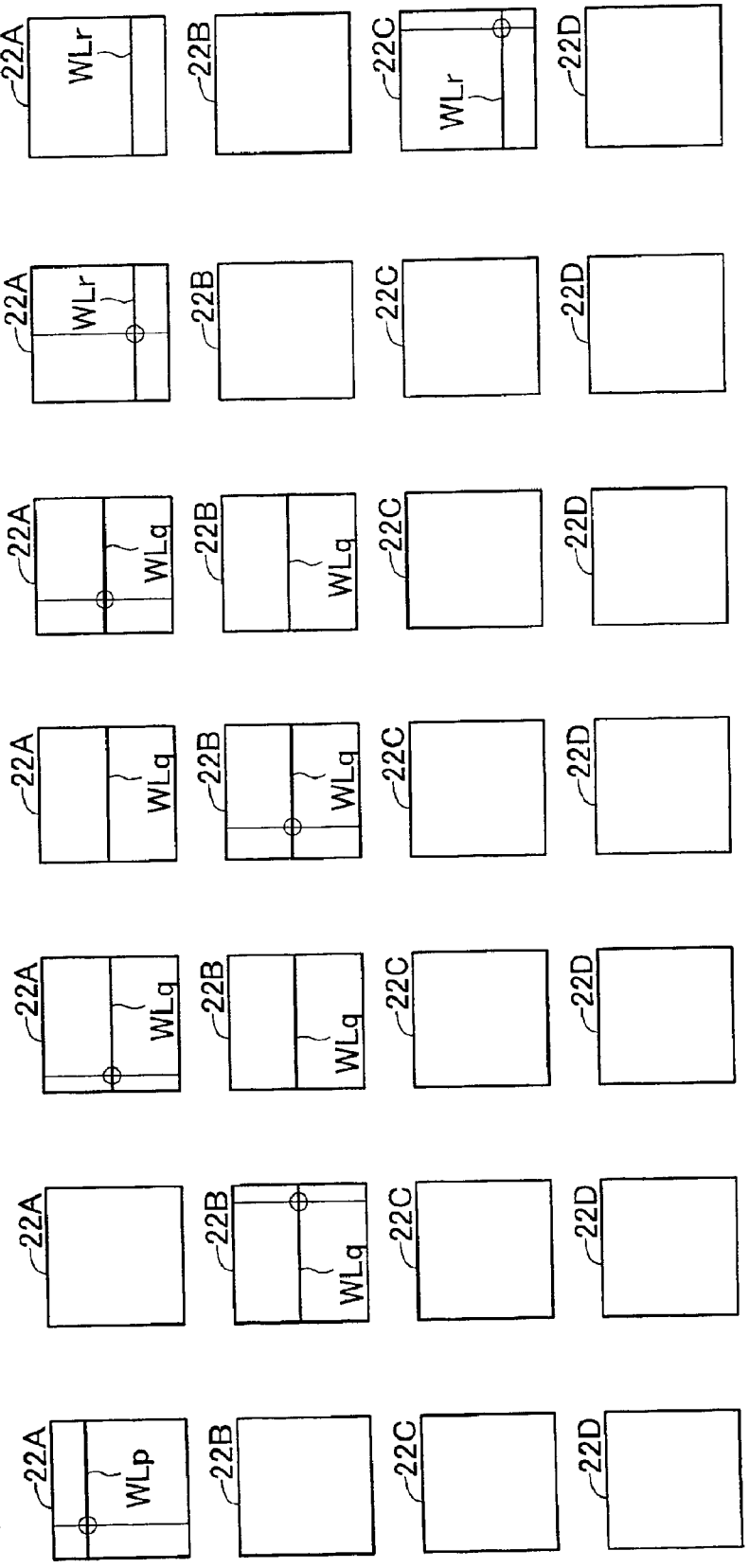
FIGS. 12(A)–12(G) are schematic representations of activated word lines in subarrays 22A–22D during each operation cycle in FIGS. 11(a)–11(q)
Figure 16:
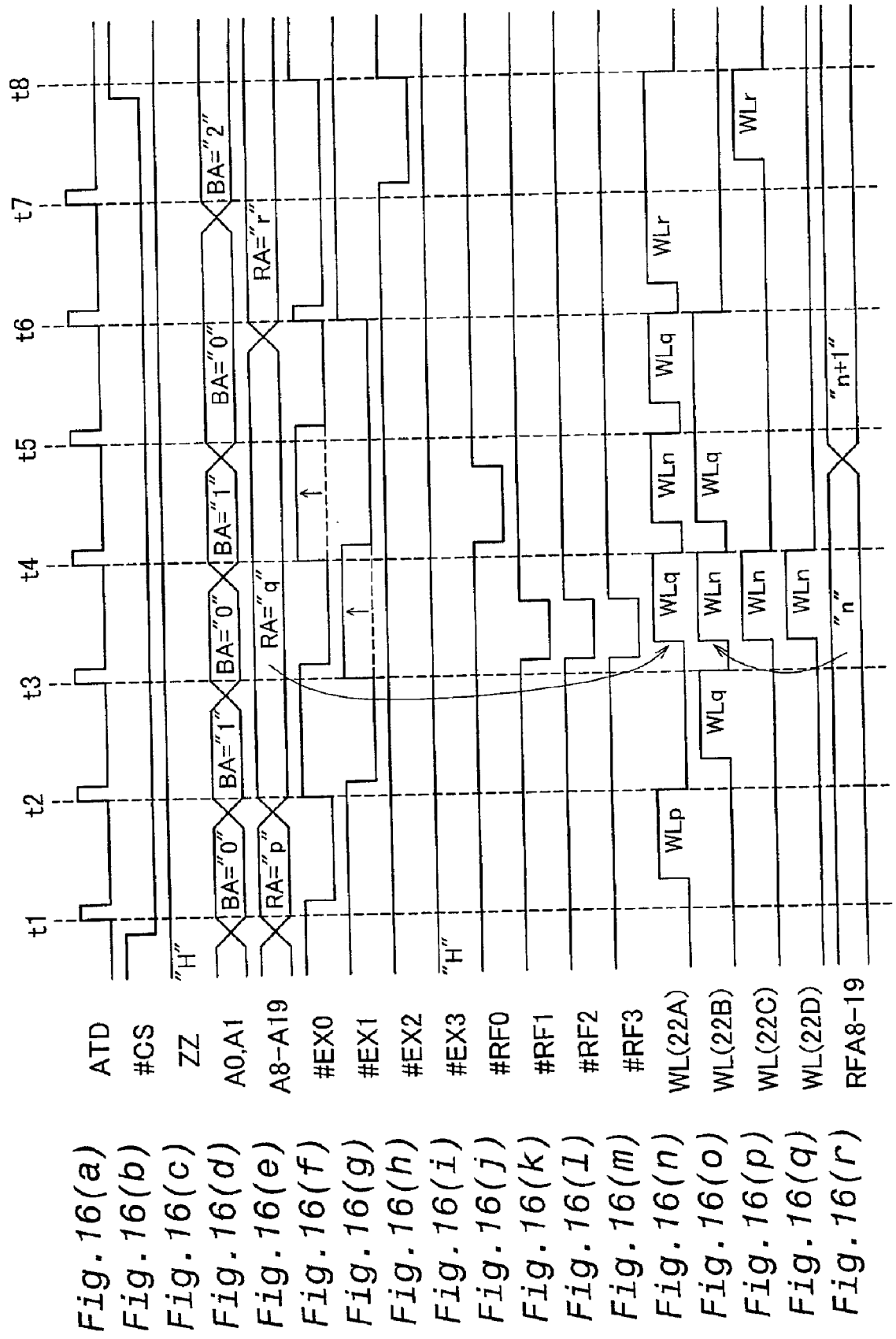
FIGS. 16(a)–16(r) are timing charts showing word line status during the operation cycles shown in FIGS. 14(a)–14(t); correspond to FIGS. 11(a)–11(q)

FIGS. 16(*a*)–16(*r*) are timing charts showing word line status during the operation cycles shown in FIGS. 14(*a*)–14(*t*), and correspond to FIGS. 11(*a*)–11(*q*). FIGS. 16(*a*)–16(*e*) are analogous to FIGS. 14(*a*)–14(*e*), FIGS. 16(*f*)–16(*i*) are analogous to FIGS. 14(*f*)–14(*i*), and FIGS. 16(*j*)–16(*m*) are analogous to FIGS. 14(*o*)–14(*r*). FIG. 16(*r*) is analogous to FIG. 14(*t*).

FIGS. 16(*n*)–16(*q*) depict the status of word lines WL in subarrays 22A–22D in blocks 20A–20D (FIG. 4).

FIGS. 17(A)–17(G) are schematic representations of activated word lines in subarrays 22A–22D during each operation cycle of FIGS. 16(*a*)–16(*r*), and correspond to FIGS. 12(A)–12(G). FIGS. 17(A)–17(G) are substantially similar to FIGS. 12(A)–12(G); only those having a "*" located at the top right of subarrays 22A–22D are different. Broken horizontal lines in subarrays 22A–22D indicate word lines that are activated during refresh operations.

As shown in FIGS. 16(*f*)–16(*i*), in the third cycle only the first external access signal #EX0 is set to L level (active). As shown in FIGS. 16(*j*)–16(*m*), the second to fourth refresh signals #RF1–#RF3 are set to L level (active). Thus, in the third cycle, while the "q"th word line WLq—selected by row address A8–A19 (FIG. 16(*e*))—in first subarray 22A is activated as shown in FIGS. 16(*n*)–16(*q*) and FIG. 17(C), and the "n"th word line WLn—selected by refresh address RFA8–RFA19 (FIG. 16(*r*))—in each of the other subarrays 22B–22D is activated as well. As will be apparent from a comparison of FIG. 16(*o*) with FIG. 11(*o*), in the second subarray 22B, once the "q"th word line WLq is deactivated, the "n"th word line WLn is activated.

Figure 17:
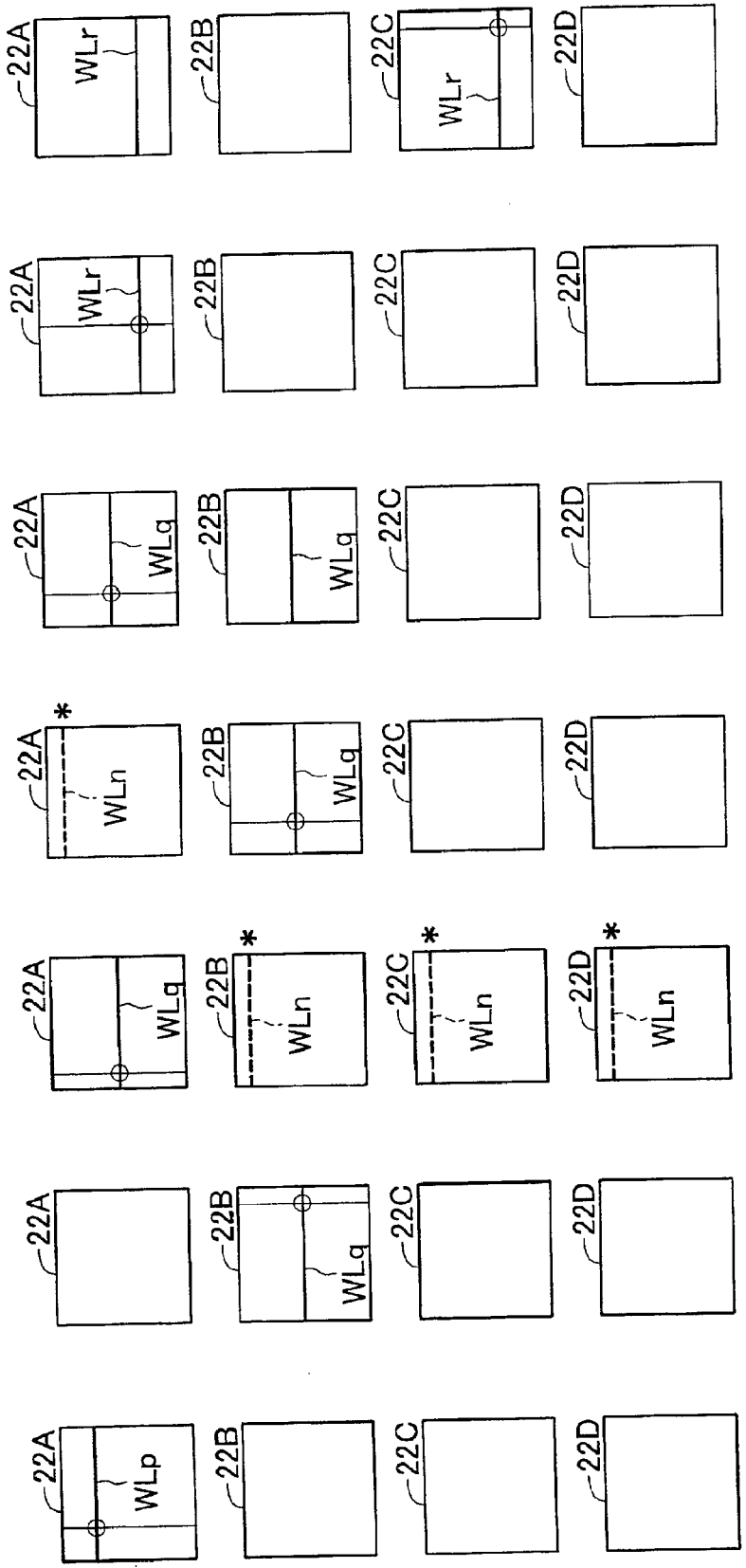
FIGS. 17(A)–17(G) are schematic representations of activated word lines in subarrays 22A–22D during each operation cycle of FIGS. 16(a)–16(r); correspond to FIGS. 12(A)–12(G)

In the third cycle, external access is performed only on memory cells in first subarray 22A, and refresh operations are performed on all memory cells on the "n"th word line WLn in each of the second to fourth subarrays 22B–22D (FIG. 17(C)).

In the fourth cycle, only the second external access signal #EX1 is set to L level (active). Only the first refresh signal #RF0 (FIG. 16(*o*)) is set to L level (active). Thus, in the fourth cycle, the "q"th word line WLq in second subarray 22B is re-activated while the "n"th word line WLn—selected by refresh address RFA8–RFA19—in first subarray 22A is activated as shown in FIGS. 16(*n*)–16(*q*) and FIG. 17(D).

In the fourth cycle, external access is performed only on memory cells in second subarray 22B, and refresh operations are performed on all memory cells on the "n"th word line WLn in the first subarray 22A (FIG. 17(D)).

In this way, all memory cells on the "n"th word line WLn—indicated by the same given refresh address RFA8–RFA19—in each of the subarrays 22A–22D in the four blocks 20A–20D are refreshed.

Figure 13:
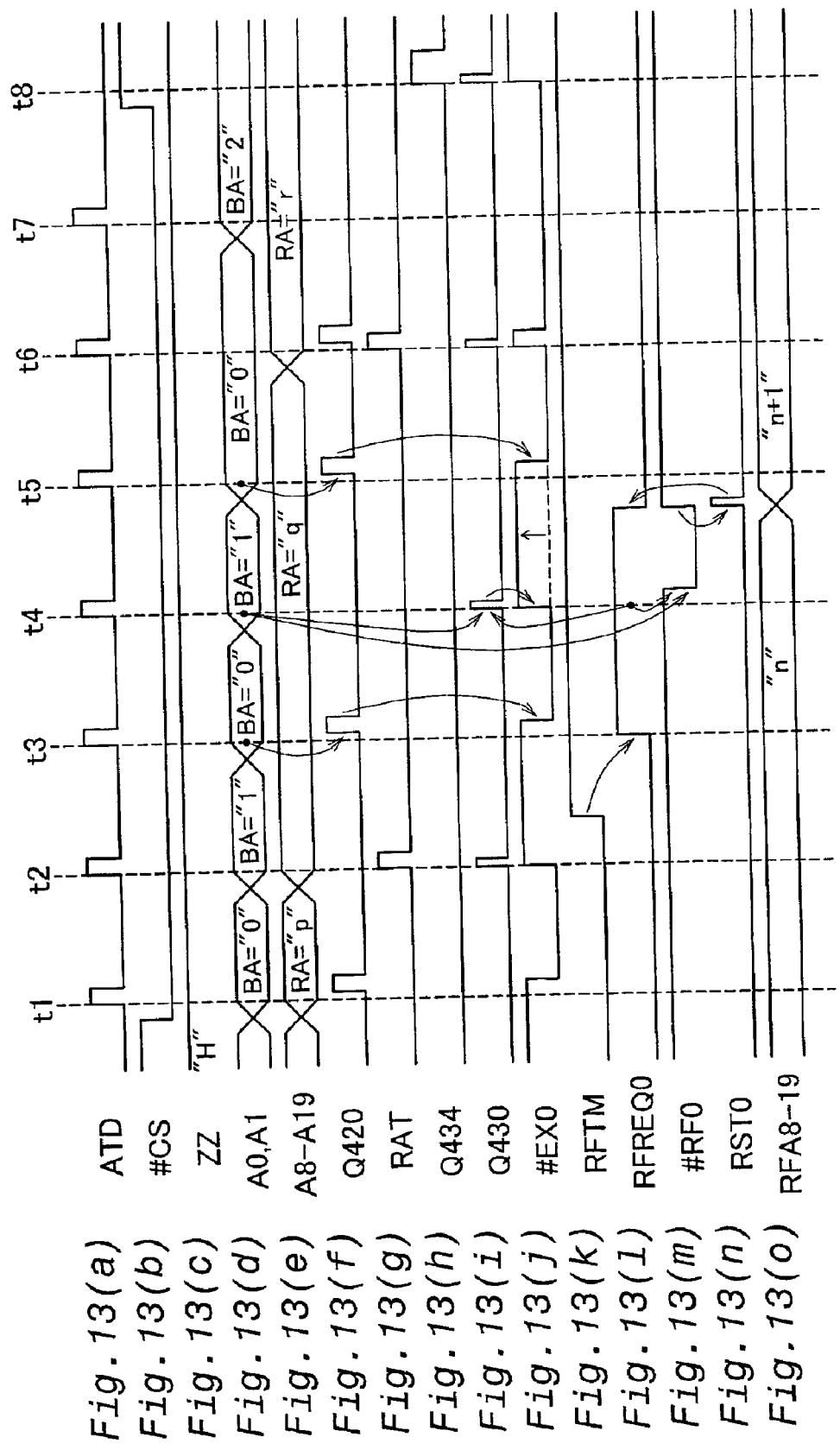
FIGS. 13(a)–13(o) are timing charts showing operation of first block controller 40A (FIG. 6) during an operation cycle in which there is a refresh request; correspond to FIGS. 9(a)–9(n)

As described in FIGS. 13(*a*)–13(*o*) through 17(A)–17(G), when a refresh operation is requested, the block controllers 40A–40D set the refresh signals for the other blocks—i.e. other than the one block to which external access has been requested—to active. In these other blocks, word lines held in the activated state are now deactivated. The word lines selected by the refresh address are then activated, and all memory cells on these word lines are refreshed.

As regards the one block being externally accessed, after there is no longer an external access request for the block, the refresh signal for the block is set to active. The activated word line in the one block is now deactivated. The word line selected by the refresh address is then activated, and all memory cells on this word line are refreshed.

When consecutive cycles use addresses that include the same given row address, the word line activation controller in the present embodiment is capable of maintaining in the activated state a word line in a first memory cell block that has been activated during the initial cycle, without deactivating it until the final cycle. When a refresh operation is performed in some cycle coming after the initial cycle and up through the final cycle, the word line activation controller can deactivate activated word lines prior to the refresh operation. This enables refresh operations to be performed in a semiconductor memory device, and since there is no need to repeatedly activate and deactivate word lines in each cycle during period that no refresh operations are performed, the power consumption associated with activation of word lines is reduced.

At the same time, the word line activation controller can maintain in the activated state a word line in a second memory cell block activated in some cycle coming after the initial cycle and up through the final cycle, without deactivating it until the final cycle. When a refresh operation is performed in some cycle coming after the initial cycle and up through the final cycle, the word line activation controller deactivates the activated word line in the first memory cell block prior to the refresh operation in the first memory cell block. When the second memory cell block contains an activated word line, the activated word line in the second memory cell block can be deactivated prior to the refresh operation in the second memory cell block.

In this way the word line activation controller can simultaneously hold in the activated state word lines in two or more memory cell blocks, and if a refresh operation is required, can deactivate activated word lines in the memory cell blocks prior to performing a refresh operation in the memory cell block.

D3. Operation in Standby Cycle and Snooze Mode:

As described with reference to FIGS. 9(*a*)–9(*n*) through 17(A)–17(G), both external access and refresh operations are enabled during operation cycles; in standby cycle and snooze mode, however, external access is disabled, and only refresh operations are enabled.

Figure 18:
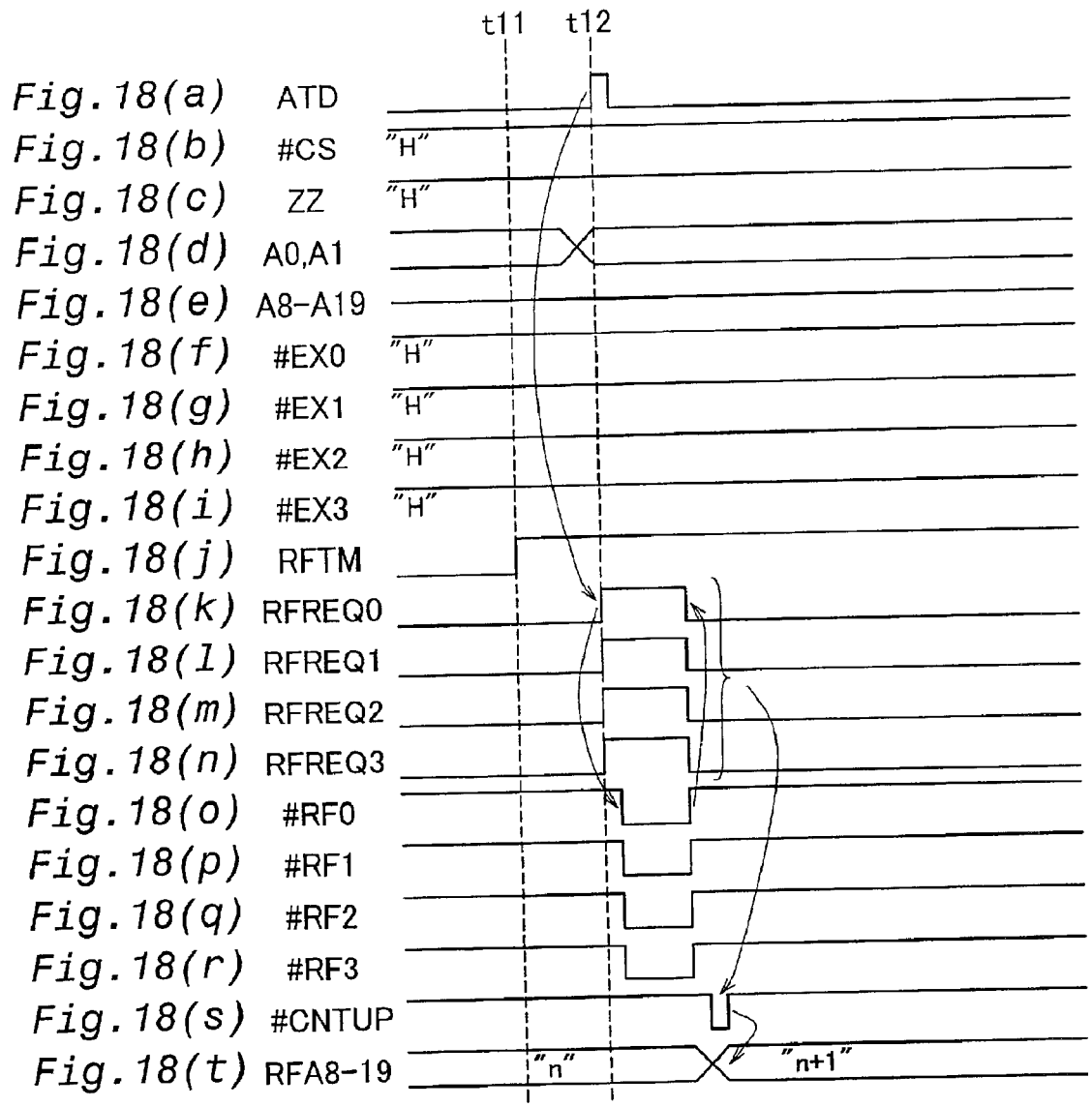
FIGS. 18(a)–18(t) are timing charts showing refresh operations of block controllers 40A–40D during standby cycle.

FIGS. 18(*a*)–18(*t*) are timing charts showing refresh operations of block controllers 40A–40D during standby cycle. In standby cycle, the chip select signal #CS (FIG. 18(*b*)) is H level (inactive) and the snooze signal ZZ (FIG. 18(*c*)) is H level.

The refresh timing signal RFTM (FIG. 18(*j*)) rises at time t11. Address A0–A19 (FIG. 18(*d*)) subsequently changes, and an ATD signal pulse is generated (FIG. 18(*a*)). As a general rule, there is no need for the address A0–A19 to change during standby cycle. As described with reference to FIG. 2, however, in the standby cycle in this embodiment there is employed a first refresh mode wherein refresh operations are executed in sync with the ATD signal. Let it be assumed that an external device periodically changes at least one address bit (A0, for example) during the standby cycle period, and internal refresh operations are performed. In preferred practice, the period for the change in the address bit will be no more than ½ the refresh period stipulated by the refresh timing signal RFTM. The reason is that if the address bit changes at an interval equivalent to ½ or less of the refresh period, an ATD signal will always be generated during the interval that the refresh timing signal RFTM is H level.

When the refresh timing signal RFTM rises, refresh request signals RFREQ0–RFREQ3 (FIGS. 18(*k*)–18(*n*)) for blocks 20A–20D rise to H level in sync with the next rising edge of the ATD signal (FIG. 18(*a*)) (time t12). Since external access is disabled during the standby cycle, external access request signals #EX0–#EX3 (FIGS. 18(f)–18(i)) to the four blocks 20A–20D are held at H level (inactive), and refresh signals #RF0–#RF3 (FIGS. 18(o)–18(r)) are set to L level (active). As a result, all word cells on the "n"th word line—indicated by the same given refresh address RFA8–RFA19(FIG. 18(t))—in each of the four blocks 20A–20D are refreshed.

When refresh operations in the four blocks 20A–20D are completed, the four refresh request signals RFREQ0–RFREQ3 (FIGS. 18(k)–18(n)) return to L level. In response to the change in level of refresh request signals RFREQ0–RFREQ3 the refresh counter controller 90 (FIG. 4) issues a countup signal #CNTUP (FIG. 18(s)).

In this way, since external access to all blocks 20A–20D is disabled during the standby cycle, refresh operations are performed simultaneously on all four blocks 20A–20D.

Figure 19:
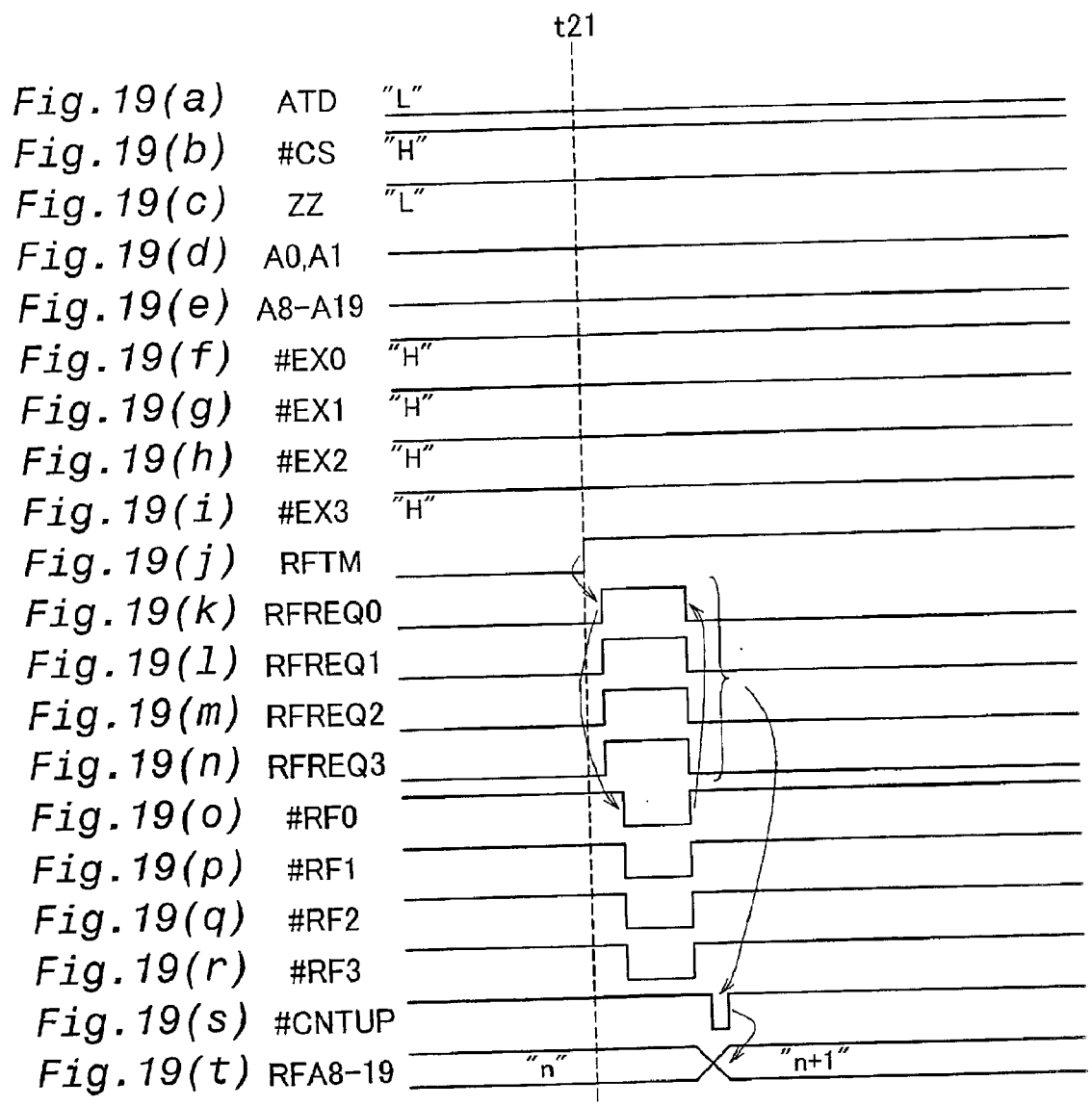
FIGS. 19(a)–19(t) are timing charts showing refresh operations of block controllers 40A–40D in snooze mode.

FIGS. 19(a)–19(t) are timing charts showing refresh operations of block controllers 40A–40D in snooze mode. In snooze mode, the chip select signal #CS (FIG. 19(b)) is H level (inactive) and the snooze signal ZZ (FIG. 19(c)) is L level. No ATD signal (FIG. 19(a)) is issued in snooze mode.

When the refresh timing signal RFTM (FIG. 19(j)) rises at time t21, refresh request signals RFREQ0–RFREQ3 (FIGS. 19(k)–19(n)) for the four blocks 20A–20D rise immediately to H level. Since external access is disabled in snooze mode, external access request signals #EX0–#EX3 (FIGS. 19(f)–19(i)) to the four blocks 20A–20D are held at H level (inactive), and refresh signals #RF0–#RF3 (FIGS. 19(o)–19(r)) drop to L level (active). As a result, all word cells on the same given "n"th word line in each of the four blocks 20A 20D are refreshed. Subsequent operation is analogous to that in standby cycle, described with reference to FIGS. 18(a)–18(t).

In this way, during operation cycles and standby cycle, once instructed by the refresh timing signal RFTM to perform a refresh operation, a refresh request signal RFREQ0 is issued in sync with the ATD signal, and in response thereto a refresh operation is initiated (first refresh mode in FIG. 2). In snooze mode, on the other hand, refresh operations are not initiated in sync with the ATD signal: when the refresh timing signal RFTM indicates that it is time to initiate a refresh operation, refresh operations are immediately performed simultaneously on all four blocks 20A–20D (second refresh mode in FIG. 2).

As shown in FIGS. 18(a)–18(t), in the standby cycle in the present embodiment refresh operations are carried out according to first refresh mode; however, refresh operations could carried out according to second refresh mode instead. This has the advantage of obviating the need to periodically change addresses to generate ATD signals.

Figure 20:
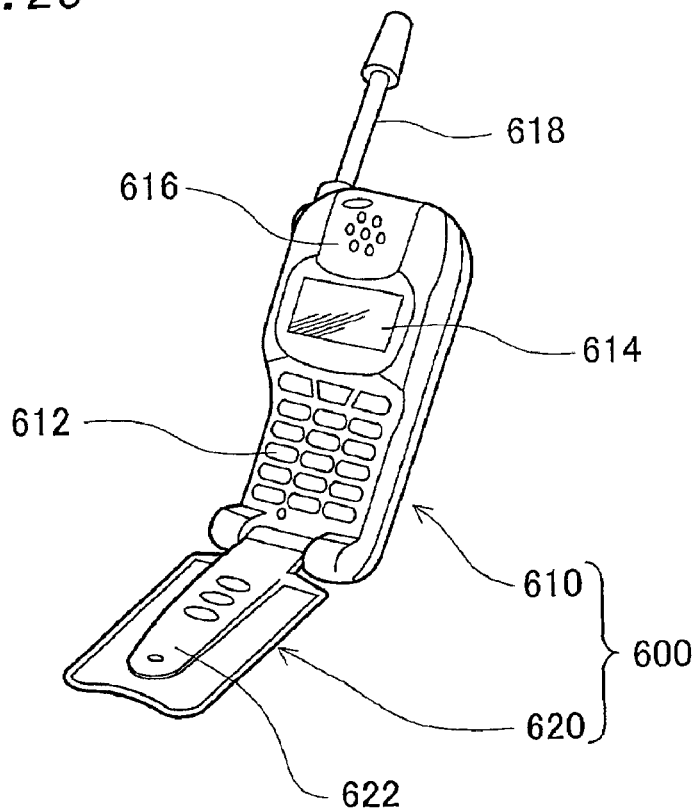
FIG. 20 is a perspective view of a mobile phone by way of an exemplary electronic device embodying the semiconductor memory device of this invention.

E. Example of Application in an Electronic Device:

FIG. 20 is a perspective view of a mobile phone by way of an exemplary electronic device embodying the semiconductor memory device of this invention. Mobile phone 600 comprises a body 610 and a cover 620. Body 610 is provided with a keyboard 612, a liquid crystal display 614, a receiver 616, and a body antenna 618. Cover 620 is provided with a transmitter 622.

Figure 21:
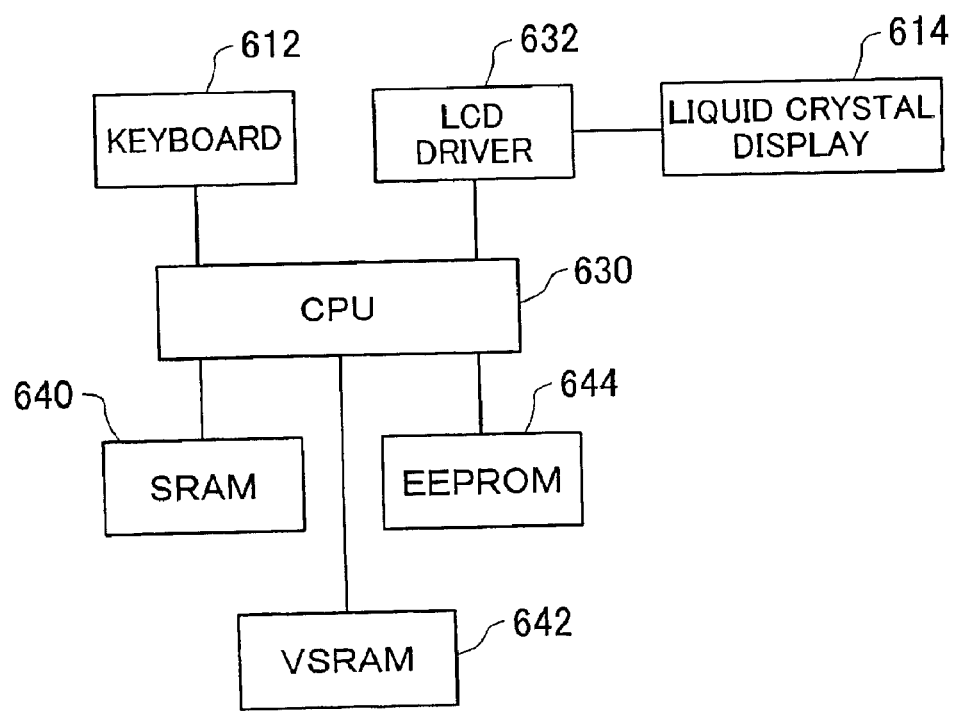
FIG. 21 a block diagram of the electronics of the mobile phone 600 of FIG. 20.

FIG. 21 is a block diagram of the electronics of the mobile phone 600 of FIG. 20. CPU 630 is connected via a bus line to keyboard 612; an LCD driver 632 for driving liquid crystal display 614; an SRAM 640, a VSRAM 642; and an EEPROM 644.

SRAM 640 is used as a high speed cache memory, for example. VRAM 642 is used as a working memory for image processing, for example. Memory chip 300 may be used for VSRAM 642 (referred to as virtual SRAM or pseudo SRAM). EEPROM 644 contains various settings for the mobile phone 600.

When operation of mobile phone 600 is temporarily suspended, VSRAM 642 may be maintained in snooze mode. By so doing, internal refresh operations in VSRAM 642 will be performed automatically, enabling data in VSRAM 642 to be preserved. As the memory chip 300 of the embodiment has relatively large capacity, a further advantage is that large amounts of data—such as image data—can be held for extended periods.

The invention is not limited to the examples and embodiments set forth hereinabove, various modifications thereof being possible without departing from the scope and spirit of the invention. Modifications such as the following are possible, for example.

(1) In the above embodiment, an ATD circuit (FIG. 4) is provided, the ATD signal being used as a clock signal for block controllers 40A–40D, etc. However, a clock signal could be provided by external device instead.

(2) In the above embodiment, the memory cell array 20 is divided into four blocks 20A–20D, but it would be possible to treat memory cell array 20 as a single block. In this case the word line activation controller will comprise a single one of each of the following elements provided for each block in FIG. 4: row decoders 30A–30D, block controllers 40A–40D, and refresh request signal generators 50A–50D. In this case, addresses will contain a row address and a column address, but not a block address.

Where memory cell array 20 is treated as a single block, the word line activation controller, upon a request for external access, simply activates the word line selected by the row address in the block and holds the activated word line until there is a change in the row address in addresses used in subsequent cycles. In subsequent cycles using address that contain the same given row address, in the event that a different column address is used, a different memory cell on the activated word line is externally accessed.

To perform a refresh operation, external access is simply suspended and the activated word line is deactivated.

Suspension of external access may be forcibly performed in the memory chip or may be performed by an external device (the CPU, for example). That is, the word line activation controller in this embodiment functions as a refresh controller so as to arbitrate between refresh and external access operations, but an external device functions as the refresh controller. The external device suspends access to the memory chip when a refresh operation becomes necessary in the semiconductor memory device.

In general, the word line activation controller has the ability, when consecutive operation cycles use addresses containing the same given row address, to maintain in the activated state a word line activated in the initial cycle of the consecutive cycles, without deactivating it until the final cycle. At the same time, the word line activation controller is configured to be able to deactivate an activated word line prior to performing a refresh operation, when a refresh operation is to be performed in any cycle from the initial cycle up through the final cycle.

As noted, where memory cell array 20 is treated as a single block, refresh operations must be performed during period in which no external access is performed. However, where a memory array is divided into a plurality of blocks, as in the above embodiment, it is possible to perform external access of one block while refreshing the other blocks (refresh transparency), as a result of which data read/write operations can be performed relatively fast.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    at least one memory cell block of dynamic memory cells arranged in a matrix, the memory cell block including a plurality of word lines;
    an address input section for input of a multiple-bit address that includes a row address for selecting one of the plurality of word lines;
    a data input/output section for input/output of data corresponding to a memory cell selected by the multiple-bit address; and
    a word line activation controller for controlling activation of the word lines;
    wherein the word line activation controller comprises:
    a row address transition detector for detecting whether the row address has changed;
    and wherein the word line activation controller is capable of:
    (a) in a first case that the row address transition detector does not detect a change in the row address during consecutive cycles in which at least one of read and write operations of data for the memory cells are enabled and in which an identical row address is used, maintaining an activated state of a word line activated during an initial cycle of the consecutive cycles, without deactivation thereof until a final cycle of the consecutive cycles; and
    (b) in a second case that a refresh operation is to be performed during a cycle among the consecutive cycles after the initial cycle, deactivating the activated word line prior to performing the refresh operation.

2. The semiconductor memory device according to claim 1, wherein the address input section is simultaneously supplied with a column address as well as with the row address; and
    the row address is assigned to a plurality of uppermost bits of the multiple-bit address.

3. The semiconductor memory device according to claim 1, wherein the semiconductor memory device comprises a plurality of the memory cell blocks; and
    the multiple-bit address includes a block address for selecting any one memory cell block from among the plurality of the memory cell blocks;
    and wherein the word line activation controller is capable of:
    in the first case,
        maintaining the activated state of the word line in a first memory cell block activated during the initial cycle, without deactivation thereof until the final cycle;
        and additionally, when a read or write operation of data on a memory cell in a second memory cell block different from the first memory cell block is performed during any arbitrary cycle among the consecutive cycles after the initial cycle, maintaining an activated state of a word line in the second memory cell block activated during the arbitrary cycle, without deactivation thereof until the final cycle; and
    in the second case,
        deactivating the activated word line in the first memory cell block prior to performing the refresh operation in the first memory cell block;
        and additionally, when the second memory cell block contains an activated word line, deactivating the activated word line in the second memory cell block prior to performing the refresh operation in the second memory cell block.

4. The semiconductor memory device according to claim 3, wherein, during a cycle in which a read or write operation of data is performed in one memory cell block from among the plurality of memory cell blocks, the refresh operation is performed on memory cell blocks other than the memory cell block on which the read or write operation of data is currently being performed, refreshing of the currently read or written memory cell block being performed during a cycle after the read or write operation has been completed;
    and wherein the word line activation controller is capable of, when each of the memory cell blocks being refreshed contains an activated word line, deactivating the activated word line just prior to performing the refresh operation in each of the memory cell blocks.

5. A method for controlling activation of word lines in a semiconductor memory device comprising: at least one memory cell block of dynamic memory cells arranged in a matrix, the memory cell block including a plurality of word lines; an address input section for input of a multiple-bit address that includes a row address for selecting one of the plurality of word lines; and a data input/output section for input/output of data corresponding to a memory cell selected by the multiple-bit address, wherein:
    (a) in a first case that no change in the row address is detected during consecutive cycles in which at least one of read and write operations of data for the memory cells are enabled and in which an identical row address is used, an activated state of a word line activated during an initial cycle of the consecutive cycles is maintained, without deactivation thereof until a final cycle of the consecutive cycles; and
    (b) in a second case that a refresh operation is to be performed during a cycle among the consecutive cycles after the initial cycle, the activated word line is deactivated prior to performing the refresh operation.

6. The method according to claim 5, wherein the address input section is simultaneously supplied with a column address as well as with the row address; and
    the row address is assigned to a plurality of uppermost bits of the multiple-bit address.

7. The method according to claim 5, wherein the semiconductor memory device comprises a plurality of the memory cell blocks; and
    the multiple-bit address includes a block address for selecting any one memory cell block from among the plurality of the memory cell blocks;
    and wherein:
    in the first case,
        the activated state of the word line in a first memory cell block activated during the initial cycle is maintained, without deactivation thereof until the final cycle;
        and additionally, when a read or write operation of data on a memory cell in a second memory cell block different from the first memory cell block is performed during any arbitrary cycle among the consecutive cycles after the initial cycle, an activated state of a word line in the second memory cell block activated during the arbitrary cycle is maintained, without deactivation thereof until the final cycle; and
    in the second case, the activated word line in the first memory cell block is deactivated prior to performing the refresh operation in the first memory cell block;

and additionally, when the second memory cell block contains an activated word line, the activated word line in the second memory cell block is deactivated prior to performing the refresh operation in the second memory cell block.

8. The method according to claim 7, wherein, during a cycle in which a read or write operation of data is performed in one memory cell block from among the plurality of memory cell blocks, the refresh operation is performed on memory cell blocks other than the memory cell block on which the read or write operation of data is currently being performed, refreshing of the currently read or written memory cell block being performed during a cycle after the read or write operation has been completed;

and wherein when each of the memory cell blocks being refreshed contains an activated word line, the activated word line is deactivated just prior to performing the refresh operation in each of the memory cell blocks.

* * * * *